(12) United States Patent
Lee et al.

US012205925B2

(10) Patent No.: US 12,205,925 B2
(45) Date of Patent: Jan. 21, 2025

(54) SEMICONDUCTOR PACKAGE HAVING PACKAGE SUBSTRATE

(71) Applicant: Samsung Electronics Co., Ltd., Suwon-si (KR)

(72) Inventors: Yongkwan Lee, Hwaseong-si (KR); Seunghwan Kim, Anyang-si (KR); Jungjoo Kim, Hwaseong-si (KR); Jongwan Kim, Cheonan-si (KR); Hyunki Kim, Anyang-si (KR); Junwoo Park, Anyang-si (KR); Hyunggil Baek, Suwon-si (KR); Junga Lee, Cheonan-si (KR); Taejun Jeon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 349 days.

(21) Appl. No.: 17/671,065

(22) Filed: Feb. 14, 2022

(65) Prior Publication Data

US 2022/0367416 A1   Nov. 17, 2022

(30) Foreign Application Priority Data

May 13, 2021   (KR) .................... 10-2021-0062157

(51) Int. Cl.
*H01L 25/065* (2023.01)
*H01L 23/00* (2006.01)
*H01L 23/498* (2006.01)
*H01L 23/538* (2006.01)

(52) U.S. Cl.
CPC .... *H01L 25/0657* (2013.01); *H01L 23/49838* (2013.01); *H01L 23/5386* (2013.01); *H01L 24/32* (2013.01); *H01L 25/0652* (2013.01); *H01L 24/16* (2013.01); *H01L 2224/16227* (2013.01); *H01L 2224/16235* (2013.01); *H01L 2224/32145* (2013.01); *H01L 2224/32225* (2013.01); *H01L 2225/06572* (2013.01)

(58) Field of Classification Search
CPC . H10B 80/00; H01L 25/0657; H01L 25/0652; H01L 23/49838; H01L 23/5386; H01L 24/32
USPC ........................................................ 257/777
See application file for complete search history.

(56) References Cited

U.S. PATENT DOCUMENTS

| | | | |
|---|---|---|---|
| 7,868,431 B2 | 1/2011 | Feng et al. |
| 8,367,470 B2 | 2/2013 | Pagaila |
| 9,343,391 B2 | 5/2016 | Oh et al. |
| 9,373,574 B2 | 6/2016 | Jang et al. |
| 9,451,700 B2 | 9/2016 | Otsubo |

(Continued)

FOREIGN PATENT DOCUMENTS

| | | | |
|---|---|---|---|
| JP | 2007035870 A | 2/2007 |
| KR | 100686823 B1 | 2/2007 |

*Primary Examiner* — Jasmine J Clark
(74) *Attorney, Agent, or Firm* — Muir Patent Law, PLLC

(57) ABSTRACT

A semiconductor package includes a package substrate having a communication hole extending from an upper surface of the package substrate to a lower surface of the package substrate, a semiconductor chip attached to the upper surface of the package substrate, an auxiliary chip attached to the lower surface of the package substrate, external connection terminals attached to the lower surface of the package substrate and spaced apart from the auxiliary chip, and an encapsulant encapsulating the semiconductor chip and the auxiliary chip and filling the communication hole.

20 Claims, 22 Drawing Sheets

(56) References Cited

U.S. PATENT DOCUMENTS

| | | |
|---|---|---|
| 9,997,444 B2 | 6/2018 | Meyer et al. |
| 10,461,044 B2 | 10/2019 | Zhang |
| 2015/0014852 A1* | 1/2015 | Liu .................. H01L 23/49827 257/737 |

* cited by examiner

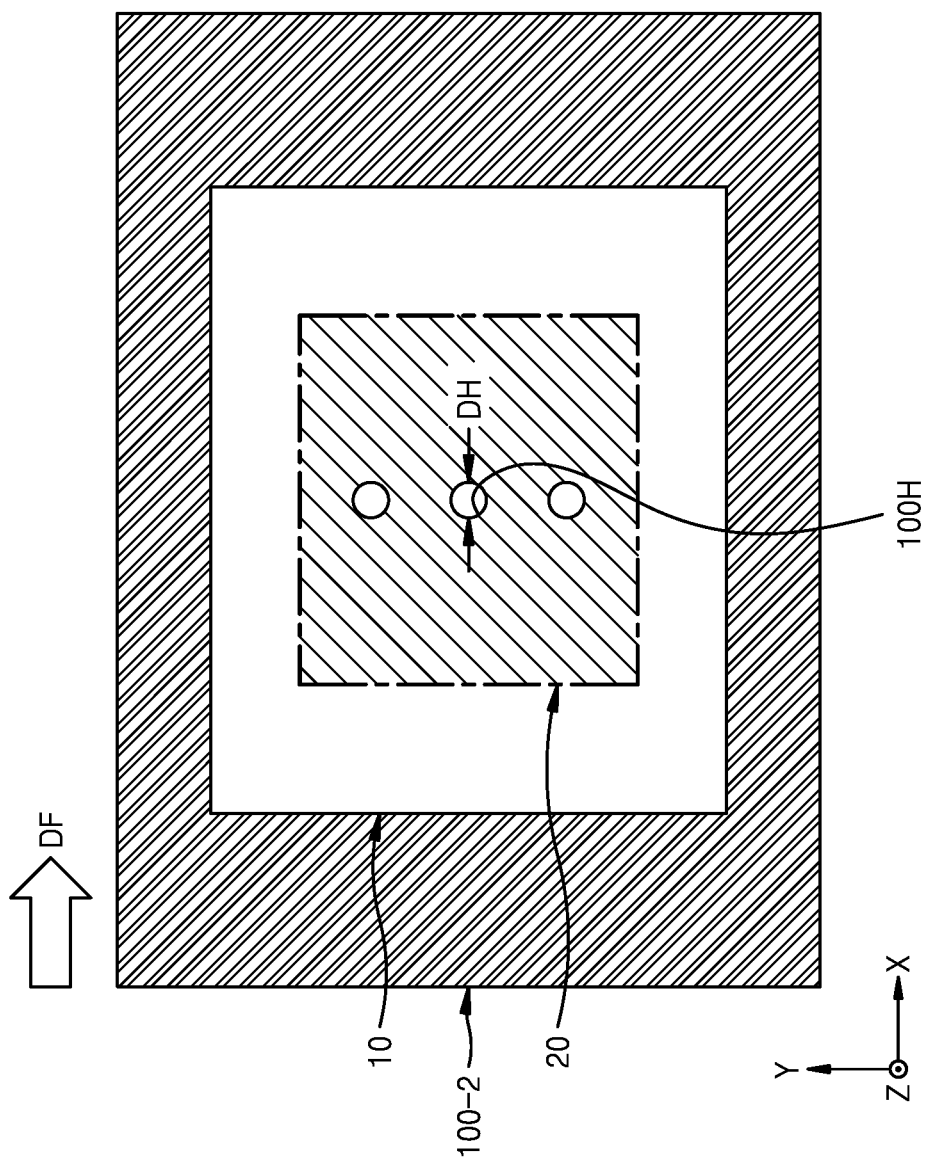

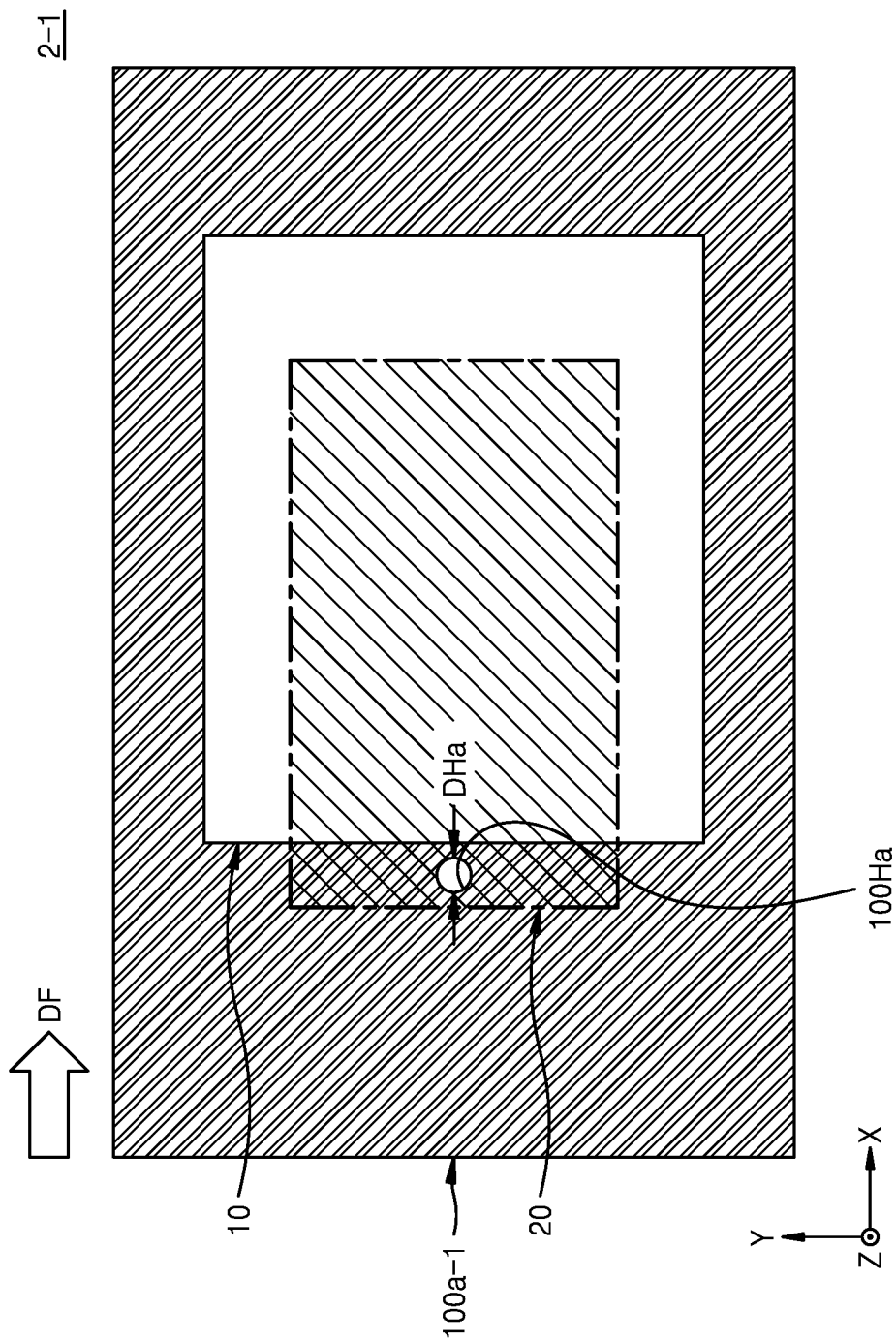

SEMICONDUCTOR PACKAGE HAVING PACKAGE SUBSTRATE

CROSS-REFERENCE TO RELATED APPLICATION

This application is based on and claims priority under 35 U.S.C. § 119 to Korean Patent Application No. 10-2021-0062157, filed on May 13, 2021, in the Korean Intellectual Property Office, the disclosure of which is incorporated by reference herein in its entirety.

BACKGROUND

The inventive concept relates to a semiconductor package, and more particularly, to a semiconductor package having a package substrate to which a semiconductor chip is attached.

In order to easily mount a semiconductor chip on an electronic product, there is provided a semiconductor package including a semiconductor chip attached to a package substrate. In addition to the semiconductor chip, the semiconductor package may include various types of auxiliary chips or unit device chips such as passive devices and active devices which are attached to the package substrate. In order to protect the semiconductor chip and/or the unit device chip attached to the package substrate, the semiconductor package uses an encapsulant such as a molding member and/or an under-fill member to encapsulate a part or all of the semiconductor chip and/or the unit device chip.

SUMMARY

A technical problem to be solved by the inventive concept is to provide a semiconductor package having a package substrate on which an encapsulant for protecting a semiconductor chip and/or a unit device chip attached to the package substrate may be easily formed.

In order to solve the above technical problem, the inventive concept provides a semiconductor package as follows.

A semiconductor package according to the inventive concept may include: a package substrate having a communication hole extending from an upper surface of the package substrate to a lower surface of the package substrate; a semiconductor chip attached to the upper surface of the package substrate; an auxiliary chip attached to the lower surface of the package substrate; a plurality of external connection terminals attached to the lower surface of the package substrate and spaced apart from the auxiliary chip; and an encapsulant encapsulating the semiconductor chip and the auxiliary chip and filling the communication hole.

A semiconductor package according to the inventive concept may include: a lower package including a lower semiconductor chip; an upper package stacked on the lower package and having an upper semiconductor chip, the lower package including a first package substrate with a communication hole extending from an upper surface of the first package substrate to a lower surface of the first package substrate with the horizontal width of the communication hole narrowing toward the lower surface of the first package substrate, the lower semiconductor chip being attached to the upper surface of the first package substrate; an auxiliary chip attached to the lower surface of the first package substrate; an encapsulant having a plurality of through-via holes extending from an upper surface of the encapsulant to a lower surface of the encapsulant, covering a portion of the lower semiconductor chip and the auxiliary chip, and filling the communication hole; a second package substrate covering the encapsulant; and a plurality of through-connecting members filling the plurality of through via-holes, respectively, and connecting the first package substrate to the second package substrate.

A semiconductor package according to the inventive concept may include: a package substrate including a substrate base, a plurality of substrate upper surface pads, and a plurality of substrate lower surface pads disposed on an upper surface of the substrate base and a lower surface of the substrate base, the plurality of substrate lower surface pads being electrically connected to and the plurality of substrate upper surface pads, and the package substrate having a communication hole having a tapered shape extending from the upper surface of the substrate base to the lower surface of the substrate base with a horizontal width of the communication hole narrowing toward the lower surface of the substrate base; a semiconductor chip including a plurality of chip pads disposed on a first surface of the semiconductor chip, the first surface facing the package substrate and being attached to the upper surface of the substrate base; a plurality of chip connecting members connecting the plurality of chip pads to the plurality of substrate upper surface pads; an auxiliary chip attached to the lower surface of the substrate base and connected to first corresponding substrate lower surface pads of the plurality of lower surface pads through a plurality of chip terminals; a plurality of external connection terminals spaced apart from the auxiliary chip and attached to second corresponding substrate lower surface pads of the plurality of lower surface pads; and an encapsulant including a main underfill portion, an auxiliary underfill portion, and a hole filling portion. The main underfill portion, the auxiliary underfill portion, and the hole filling portion integrally form the encapsulant. The main underfill portion fills a space between the first surface of the semiconductor chip and an upper surface of the package substrate and encapsulates the plurality of chip connection members. The auxiliary underfill portion fills a space between an upper surface of the auxiliary chip and the lower surface of the package substrate and encapsulates the plurality of chip terminals. The hole filling portion fills the communication hole and is connected to the main underfill portion and the auxiliary underfill portion.

BRIEF DESCRIPTION OF THE DRAWINGS

Embodiments of the inventive concept will be more clearly understood from the following detailed description taken in conjunction with the accompanying drawings in which:

FIGS. 2A and 2B are layout views illustrating a planar arrangement of main components of a semiconductor package according to the inventive concept;

FIGS. 5A and 5B are layout views illustrating a planar arrangement of main components of a semiconductor package according to the inventive concept;

DETAILED DESCRIPTION OF THE EMBODIMENTS

Figure 1:
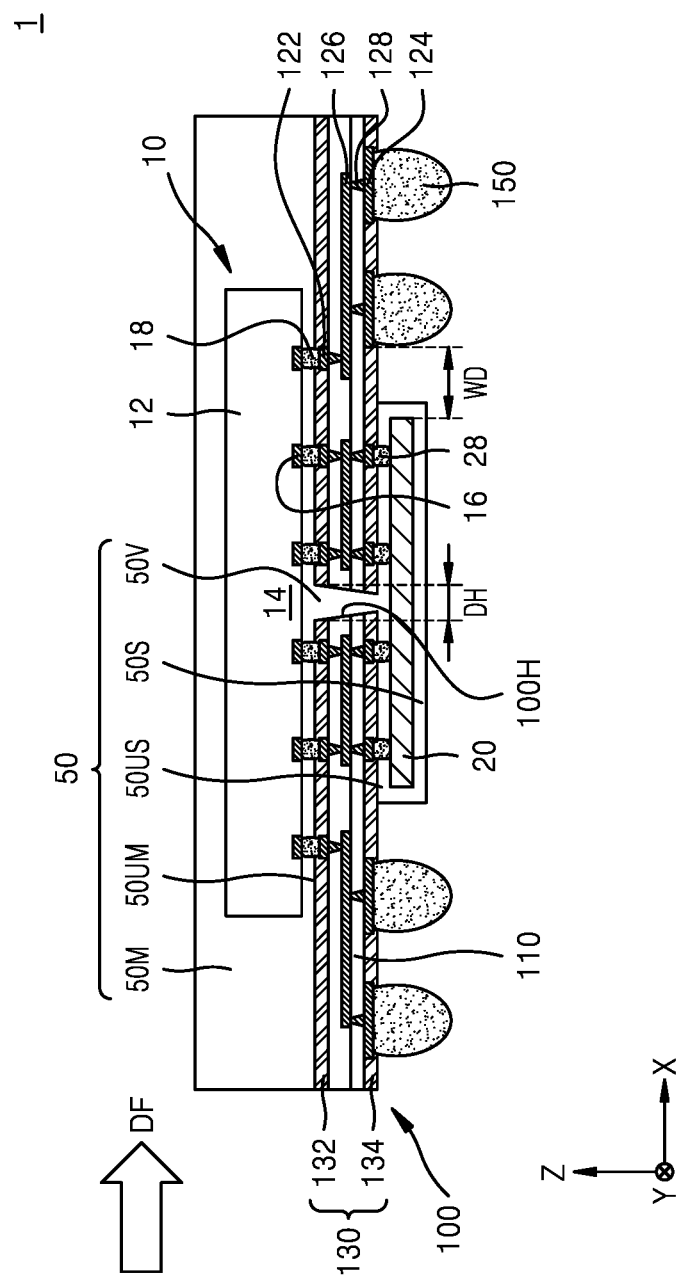
FIG. 1 is a cross-sectional view showing a semiconductor package according to the inventive concept.

FIG. 1 is a cross-sectional view showing a semiconductor package according to the inventive concept.

Referring to FIG. 1, a semiconductor package 1 may include a package substrate 100, a semiconductor chip 10 attached to an upper surface of the package substrate 100, an auxiliary chip 20 attached to a lower surface of the package substrate 100, and an encapsulant 50 encapsulating the semiconductor chip 10 and the auxiliary chip 20.

The package substrate 100 may include a substrate base 110, a plurality of substrate upper surface pads 122 and a plurality of substrate lower surface pads 124 respectively disposed on the upper and lower surfaces of the substrate base 110, and a plurality of substrate vias 128 penetrating at least a portion of the substrate base 110. In some embodiments, the substrate base 110 may be formed of a stacked structure of a plurality of base layers, and the package substrate 100 may further include a plurality of internal wiring patterns 126 disposed on an upper surface and/or a lower surface of each of the plurality of base layers. Among the plurality of substrate upper surface pads 122 and the plurality of substrate lower surface pads 124, each of the substrate upper surface pads 122 and a corresponding one of the substrate lower surface pads 124 may be electrically connected with each other through some of the plurality of substrate vias 128, or may be electrically connected through some of the plurality of substrate vias 128 and some of the plurality of internal wiring patterns 126.

In some embodiments, the package substrate 100 may be a printed circuit board. For example, the package substrate 100 may be a multi-layer printed circuit board.

The substrate base 110 may be made of at least one material selected from phenol resin, epoxy resin, and polyimide. The substrate base 110 may include or may be formed of, for example, at least one material selected from frame retardant 4 (FR4), tetrafunctional epoxy, polyphenylene ether, epoxy/polyphenylene oxide, bismaleimide triazine (BT), thermount, cyanate ester, polyimide, and liquid crystal polymer.

In some embodiments, the plurality of upper substrate pads 122, the plurality of substrate lower surface pads 124, the plurality of internal wiring patterns 126, and the plurality of substrate vias 128 may include or may be formed of copper. For example, the plurality of substrate upper surface pads 122, the plurality of substrate lower surface pads 124, the plurality of internal wiring patterns 126, and the plurality of substrate vias 128 may include or may be formed of an electrolytically deposited (ED) copper foil, rolled-annealed (RA) copper foil, ultra-thin copper foils, sputtered copper, copper alloys, or the like.

In some embodiments, the package substrate 100 may further include a solder resist layer 130 covering the upper and lower surfaces of the substrate base 110. The solder resist layer 130 may include an upper surface solder resist layer 132 that exposes the plurality of substrate upper surface pads 122 and covers the upper surface of the substrate base 110 and a lower surface solder resist layer 134 that exposes the plurality of substrate lower surface pads 124 and covers the lower surface of the substrate base 110.

The package substrate 100 may have at least one communication hole 100H extending from an upper surface of the package substrate 100 to a lower surface of the package substrate 100 and penetrating the package substrate 100. The communication hole 100H allows a space on the upper surface of the package substrate 100 to communicate with a space on the lower surface of the package substrate 100. In some embodiments, the communication hole 100H may connect a first space between a lower surface of a semiconductor substrate 12 and an upper surface of the package substrate 100 to a second space between a lower surface of the package substrate 100 and an upper surface of the auxiliary chip 20. In some embodiments, the communication hole 100H may have a tapered shape extending from the upper surface to the lower surface of the package substrate 100 with the horizontal width of the communication hole 100H narrowing toward the lower surface of the package substrate 100. The communication hole 100H may have a hole diameter DH. The hole diameter DH may be, for example, about 30 μm to about 200 μm. In some embodiments, when the communication hole 100H has a tapered shape extending from the upper surface to the lower surface of the package substrate 100 with the horizontal width of the communication hole 100H narrowing toward the lower surface of the package substrate 100, the hole diameter DH may be about 50 μm or more at the upper surface of the package substrate 100 and about 30 μm or more at the lower surface of the package substrate 100. Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

In some embodiments, at least one communication hole 100H of the package substrate 100 may be under the semiconductor chip 10. In some embodiments, the semiconductor chip 10 may cover the at least one communication hole 100H. For example, all portions of the at least one communication hole 100H may overlap the semiconductor chip 10 in a vertical direction (Z direction). The at least one communication hole 100H may communicate with (i.e., may be connected to) a space between the semiconductor chip 10 and the package substrate 100. In some embodiments, at least one communication hole 100H of the package substrate 100 may be located on the auxiliary chip 20. In some embodiments, the auxiliary chip 20 may cover the at least one communication hole 100H. For example, all portions of the at least one communication hole 100H may overlap the auxiliary chip 20 in the vertical direction (Z direction). The at least one communication hole 100H may communicate with (i.e., may be connected to) a space between the auxiliary chip 20 and the package substrate 100.

In some embodiments, the at least one communication hole 100H may be disposed in a portion of the package substrate 100 in which the semiconductor chip 10 and the auxiliary chip 20 overlap each other in the vertical direction (Z direction) to communicate a space between the semiconductor chip 10 and the package substrate 100 and a space between the auxiliary chip 20 and the package substrate 100 with each other.

The semiconductor chip 10 may include a semiconductor substrate 12 having an active surface and an inactive surface opposite to each other, a semiconductor device 14 formed at the active surface of the semiconductor substrate 12, and a plurality of chip pads 16 disposed on a first surface of the semiconductor chip 10. In this specification, the first surface of the semiconductor chip 10 and a second surface of the semiconductor chip 10 are opposite to each other, and the second surface of the semiconductor chip 10 means the inactive surface of the semiconductor substrate 12. Because the active surface of the semiconductor substrate 12 is very adjacent to the first surface of the semiconductor chip 10, it is omitted to illustrate the active surface of the semiconductor substrate 12 separately from the first surface of the semiconductor chip 10.

In some embodiments, the semiconductor chip 10 may have a face-down arrangement in which the first surface thereof faces the package substrate 100, and be attached to the upper surface of the package substrate 100. In this case, the first surface of the semiconductor chip 10 may be referred to as a lower surface of the semiconductor chip 10, and the second surface of the semiconductor chip 10 may be referred to as an upper surface of the semiconductor chip 10. For example, a plurality of chip connecting members 18 may be between the plurality of chip pads 16 of the semiconductor chip 10 and the plurality of substrate upper surface pads 122 of the package substrate 100. For example, the chip connecting member 18 may be a solder ball or a micro bump. The semiconductor chip 10 and the package substrate 100 may be electrically connected with each other through the plurality of chip connecting members 18.

Unless otherwise specified in the present specification, the upper surface refers to a surface facing upward in the drawing, and the lower surface refers to a surface facing downward in the drawing.

The semiconductor substrate 12 may include or may be formed of, for example, a semiconductor material such as silicon (Si) and germanium (Ge). In some embodiments, the semiconductor substrate 12 may include or may be formed of a compound semiconductor material such as silicon carbide (SiC), gallium arsenide (GaAs), indium arsenide (InAs), and indium phosphide (InP). The semiconductor substrate 12 may include a conductive region (for example, a well) doped with impurities. The semiconductor substrate 12 may have various device isolation structures such as a shallow trench isolation (STI) structure.

The semiconductor device 14 including various types of a plurality of individual devices may be formed at the active surface of the semiconductor substrate 12. The plurality of individual devices may include various microelectronic devices, for example, a metal-oxide-semiconductor field effect transistor (MOSFET) such as complementary metal-oxide semiconductor (CMOS) transistor, a system large scale integration (LSI), an active device, a passive device, and the like. The plurality of individual devices may be electrically connected to the conductive region of the semiconductor substrate 12. The semiconductor device 14 may further include a conductive wire or a conductive plug electrically connecting at least two of the plurality of individual devices with each other, or the plurality of individual devices to the conductive region of the semiconductor substrate 12. Each of the plurality of individual elements may be electrically isolated from neighboring individual elements by an insulating layer.

In some embodiments, the semiconductor chip 10 may be a central processing unit (CPU) chip, a graphics processing unit (GPU) chip, or an application processor (AP) chip. In some embodiments, the semiconductor chip 10 may be, for example, a memory semiconductor chip. The memory semiconductor chip may be, for example, a nonvolatile memory semiconductor chip such as flash memory, phase-change random access memory (PRAM), magnetoresistive random access memory (MRAM), ferroelectric random access memory (FeRAM), or resistive random access memory (RRAM). The flash memory may be, for example, a NAND flash memory or a V-NAND flash memory. In some embodiments, the semiconductor chip 10 may be a volatile memory semiconductor chip such as dynamic random access memory (DRAM) and static random access memory (SRAM).

The auxiliary chip 20 may be a semiconductor chip of a different type from that of the semiconductor chip 10. In this specification, the semiconductor chip 10 may hereinafter be referred to as a main semiconductor chip 10 to clearly distinguish the semiconductor chip 10 from the auxiliary chip 20. The auxiliary chip 20 may have a smaller horizontal width and smaller horizontal area than the main semiconductor chip 10, and may be a semiconductor chip for assisting the operation of the main semiconductor chip 10. For example, the auxiliary chip 20 may be a silicon capacitor, a controller chip, or a memory semiconductor chip, but is not limited thereto.

In some embodiments, when the main semiconductor chip 10 is a CPU chip, a GPU chip, or an AP chip, the auxiliary chip 20 may be a silicon capacitor. In some embodiments, the silicon capacitor may include silicon-based dielectrics such as silicon nitride and silicon dioxide as a capacitor dielectric.

In some embodiments, when the main semiconductor chip 10 is a non-volatile memory semiconductor chip such as a flash memory, the auxiliary chip 20 may be a controller chip having a controller built therein. The controller may control access to data stored in the main semiconductor chip 10. For example, the controller may control a write/read operation of the main semiconductor chip 10, for example, a flash memory, depending on a control command from an external host. The controller may perform wear leveling, garbage collection, bad block management, or error correction code (ECC) for the nonvolatile memory semiconductor chip.

In some embodiments, when the main semiconductor chip 10 is a memory semiconductor chip, the auxiliary chip 20 may be a memory semiconductor chip having a capacity and/or operation speed different from that of the main semiconductor chip 10. For example, the auxiliary chip 20 may be a memory semiconductor chip that performs a buffer function.

The auxiliary chip 20 may be connected to some of the plurality of substrate lower surface pads 124 of the package substrate 100 through a plurality of chip terminals 28. In some embodiments, the plurality of chip terminals 28 may be micro pins or micro bumps attached to the auxiliary chip 20, but is not limited thereto. For example, the auxiliary chip 20 may have four or more chip terminals 28. In some embodiments, the auxiliary chip 20 may have a plurality of connection pads similar to the plurality of chip pads 16 of the semiconductor chip 10, and the plurality of chip terminals 28 may be solder balls or micro bumps between the plurality of connection pads and some of the plurality of substrate lower surface pads 124.

The encapsulant 50 may encapsulate the semiconductor chip 10 and the auxiliary chip 20. The encapsulant 50 may cover at least a portion of the upper surface of the package substrate 100, and may cover a portion of the lower surface of the package substrate 100. In some embodiments, the encapsulant 50 may cover all of the upper surface (i.e., the entire upper surface) of the package substrate 100, and may cover a portion of the lower surface of the package substrate 100, but may not cover the remaining portion thereof. For example, the encapsulant 50 may be, for example, a molding member including or being formed of an epoxy mold compound (EMC).

The encapsulant 50 may include a main encapsulation portion 50M, a main underfill portion 50UM, an auxiliary encapsulation portion 50S, an auxiliary underfill portion 50US, and a hole filling portion 50V. The main encapsulation portion 50M, the main underfill portion 50UM, the auxiliary encapsulation portion 50S, the auxiliary underfill portion 50US, and the hole filling portion 50V may be integrally formed to constitute the encapsulant 50.

The main encapsulation portion 50M may cover the semiconductor chip 10 on the upper surface of the package substrate 100. In some embodiments, the main encapsulation portion 50M may cover both the second surface, that is, the upper surface and the side surface of the semiconductor chip 10. In some other embodiments, the main encapsulation portion 50M may cover the side surface of the semiconductor chip 10, but may expose the second surface (i.e., the upper surface) of the semiconductor chip 10 without covering the second surface. The main underfill portion 50UM may fill a space between the first surface (i.e., the lower surface) of the semiconductor chip 10 and the upper surface of the package substrate 100, and surround the plurality of chip connecting members 18. For example, the main underfill portion 50UM may surround each of the plurality of chip connecting members 18.

The auxiliary encapsulation portion 50S may cover the auxiliary chip 20 on the lower surface of the package substrate 100. In some embodiments, the auxiliary encapsulation portion 50S may cover both the lower surface and the side surface of the auxiliary chip 20. In some other embodiments, the auxiliary encapsulation portion 50S may cover the side surface of the auxiliary chip 20, but may expose the lower surface of the auxiliary chip 20 without covering the lower surface thereof. The auxiliary underfill portion 50US may fill a space between the upper surface of the auxiliary chip 20 and the lower surface of the package substrate 100, and surround the plurality of chip terminals 28. For example, the auxiliary underfill portion 50US may surround each of the plurality of chip terminals 28. The hole filling portion 50V may fill the communication hole 100H. The hole filling portion 50V may have a tapered shape extending from the upper surface to the lower surface of the package substrate 100, that is, from the upper end to the lower end of the communication hole 100H with the horizontal width of the communication hole 100H narrowing toward the lower surface of the package substrate 100.

The encapsulant 50 may include the main underfill portion 50UM and the auxiliary underfill portion 50US that are molded under-fill (MUF) which may fill a narrow gap between a chip and a substrate with mold resin.

The main encapsulation portion 50M and the main underfill portion 50UM may be connected with each other, and the auxiliary encapsulation portion 50S and the auxiliary underfill portion 50US may be connected with each other, an upper end of the hole filling portion 50V may be connected to the main underfill portion 50UM, and a lower end thereof may be connected to the auxiliary underfill portion 50US.

Each of the main encapsulation portion 50M, the main underfill portion 50UM, the auxiliary encapsulation portion 50S, the auxiliary underfill portion 50US, and the hole filling portion 50V may be referred to as distinguishing portions included in the encapsulant 50. Each name of the distinguishing portions may represent a position at which each distinguishing portion is disposed in the encapsulant 50 for the convenience of description. The main encapsulation portion 50M, the main underfill portion 50UM, the auxiliary encapsulation portion 50S, the auxiliary underfill portion 50US, and the hole filling portion 50V may be integrally formed by a single manufacturing process to form the encapsulant 50.

In some embodiments, the main encapsulation portion 50M may cover the entire upper surface of the package substrate 100, and the auxiliary encapsulation portion 50S may cover a portion of the lower surface of the package substrate 100 but not the remaining portion thereof. For example, the horizontal width of the main encapsulation portion 50M may have a greater value than the horizontal width of the auxiliary encapsulation portion 50S.

The main semiconductor chip 10 may have a larger horizontal width and a larger horizontal area than the auxiliary chip 20, and the main underfill portion 50UM may have a larger horizontal width and a larger horizontal area than the auxiliary underfill portion 50US.

In some embodiments, after the semiconductor chip 10 and the auxiliary chip 20 are attached to the upper and lower surfaces of the package substrate 100, the encapsulant 50 may be formed by injecting an encapsulation material into the upper surface of the package substrate 100 in an injection direction DF. In some embodiments, the injection direction DF may be a first horizontal direction (X direction). After the encapsulation material is first injected into the upper surface of the package substrate 100, the encapsulation material may be supplied to the space between the semiconductor chip 10 and the package substrate 100, and sequentially supplied along the communication hole 100H to the lower surface of the package substrate 100 to form the encapsulant 50.

According to the inventive concept, the encapsulant 50 encapsulating the semiconductor chip 10 attached to the upper surface of the package substrate 100 and the auxiliary chip 20 attached to the lower surface of the package substrate 100 may be formed in one manufacturing process, and thus the process steps of manufacturing the semiconductor package 1 may be reduced, and manufacturing costs of the semiconductor package 1 may be reduced.

A plurality of external connection terminals 150 may be attached to other portions of the plurality of lower surface pads 124. The plurality of external connection terminals 150 may electrically connect the semiconductor package 1 to the outside.

The auxiliary chip 20 may be spaced apart from the plurality of external connection terminals 150 with a separation distance WD. The separation distance WD may be less than about 100 µm. In the semiconductor package 1, after an encapsulation material for forming the encapsulant 50 is first injected into the upper surface of the package substrate 100, the encapsulation material is supplied to the space between the semiconductor chip 10 and the package substrate 100 and sequentially supplied along the communication hole 100H to the lower surface of the package substrate 100 to form the encapsulant 50. Thus, the semiconductor package 1 does not require an additional space for injecting the encapsulation material into the lower surface of the package substrate 100. Therefore, the separation distance WD between the auxiliary chip 20 and the plurality of external connection terminals 150 may be reduced, thereby minimizing a horizontal area of the semiconductor package 5, and thus, the size (i.e., a form factor) of the semiconductor package 5 may be reduced.

Figure 2A:
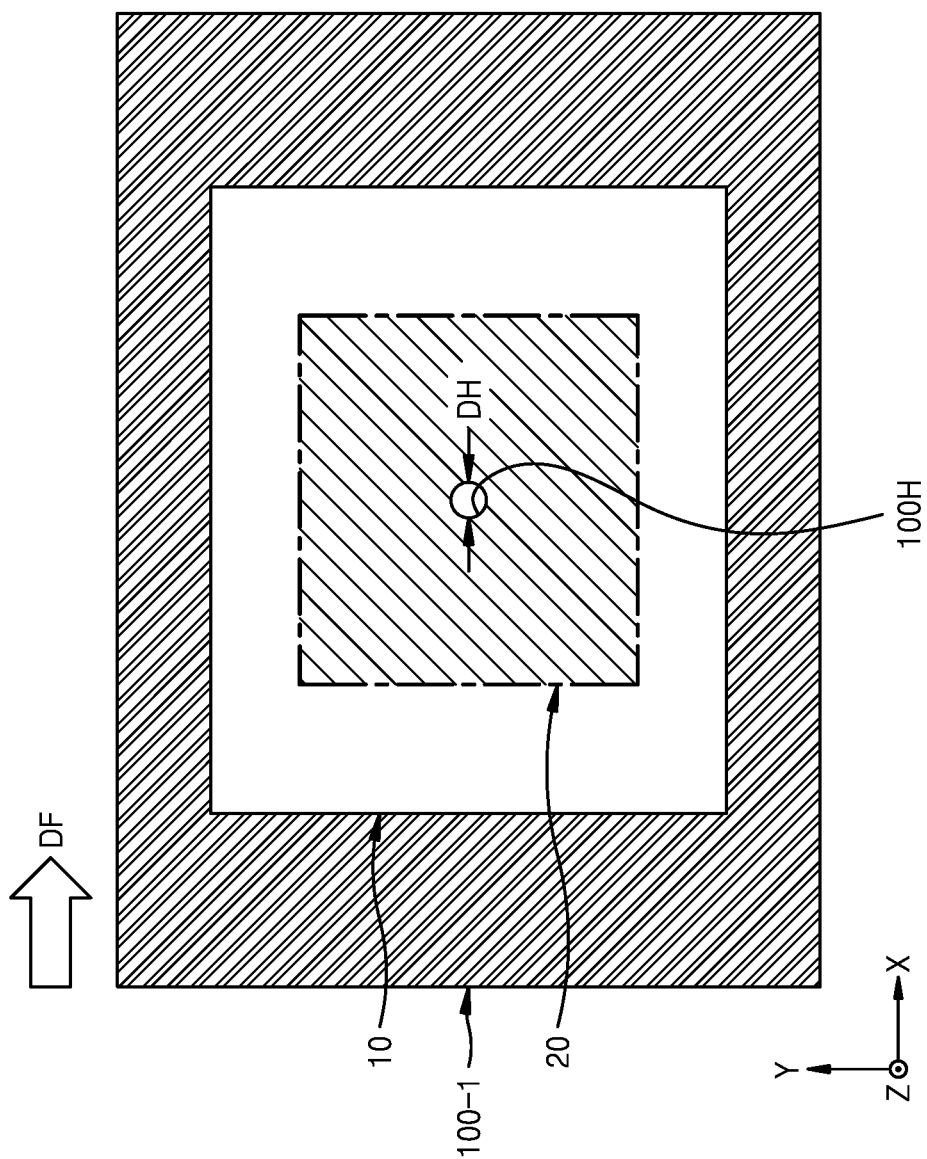

FIGS. 2A and 2B are layout views illustrating a planar arrangement of main components of a semiconductor package according to the inventive concept. For example, a cross-sectional view of each of a semiconductor package 1-1 shown in FIG. 2A and a semiconductor package 1-2 shown in FIG. 2B is the same as the cross-sectional view of the semiconductor package 1 shown in FIG. 1, and in the descriptions of FIGS. 2A and 2B, FIG. 1 may also be referred to.

Referring to FIG. 2A, the semiconductor package 1-1 may include a package substrate 100-1, a semiconductor chip 10 attached to an upper surface of the package substrate 100-1, and an auxiliary chip 20 attached to a lower surface of the package substrate 100-1.

The package substrate 100-1 may have at least one communication hole 100H extending from an upper surface of the package substrate 100-1 to a lower surface of the package substrate 100-1 and penetrating the package substrate 100-1. All portions of the communication hole 100H may overlap the semiconductor chip 10 in the vertical direction (Z direction), and all portions of the communication hole 100H may overlap the auxiliary chip 20 in a vertical direction (Z direction). For example, the communication hole 100H may be disposed in a portion of the package substrate 100-1 where the semiconductor chip 10 and the auxiliary chip 20 overlap each other in the vertical direction (Z direction).

In some embodiments, the communication hole 100H may be disposed in a central portion of the auxiliary chip 20 in an X-Y plane, in a central portion of the auxiliary chip 20 or in a portion adjacent to the center, in a top view. Because the semiconductor package 1-1 may include the communication hole 100H disposed at a central portion of the auxiliary chip 20 in the X-Y plane, an encapsulation material for forming the encapsulant 50 shown in FIG. 1 may be supplied from a central portion of a space between the package substrate 100-1 and the auxiliary chip 20 to the space therebetween, and thus, the encapsulant 50 may encapsulate the auxiliary chip 20 by uniformly filling the space between the package substrate 100-1 and the auxiliary chip 20.

Referring to FIG. 2B, the semiconductor package 1-2 may include a package substrate 100, a semiconductor chip 10 attached to an upper surface of a package substrate 100-2, and an auxiliary chip 20 attached to a lower surface of the package substrate 100-2.

The package substrate 100-2 may have at least one communication hole 100H extending from an upper surface of the package substrate 100-2 to a lower surface of the package substrate 100-2 and penetrating the package substrate 100-2. All portions of each of the plurality of communication holes 100H may overlap the semiconductor chip 10 in a vertical direction (Z direction), and all portions of each of the plurality of communication holes 100H may overlap the auxiliary chip 20 in the vertical direction (Z direction). For example, a plurality of communication holes 100H may be disposed in a portion of the package substrate 100-2 where the semiconductor chip 10 and the auxiliary chip 20 overlap each other in the vertical direction (Z direction).

The encapsulation material for forming the encapsulant 50 shown in FIG. 1 may be injected in an injection direction DF. For example, the injection direction DF may be a first horizontal direction (X direction). In some embodiments, the plurality of communication holes 100H may be disposed in a central portion of the auxiliary chip 20 in the first horizontal direction (X direction).

In some embodiments, the plurality of communication holes 100H may be arranged in a row in a second horizontal direction (Y direction) orthogonal to a first horizontal direction (X direction) that is the injection direction DF.

Because the semiconductor package 1-2 has a plurality of communication holes 100H arranged in a row in the second horizontal direction (Y direction) orthogonal to the first horizontal direction (X direction) that is the injection direction DF, the encapsulation material may be supplied to a space between the package substrate 100-2 and the auxiliary chip 20 through a plurality of communication holes 100H that are arranged in a row in the second horizontal direction (Y direction), and thus, the encapsulant 50 may encapsulate the auxiliary chip 20 by uniformly filling the space between the package substrate 100-2 and the auxiliary chip 20. In some embodiments, the plurality of communication holes 100H may be arranged in two or more rows.

Figure 3A:
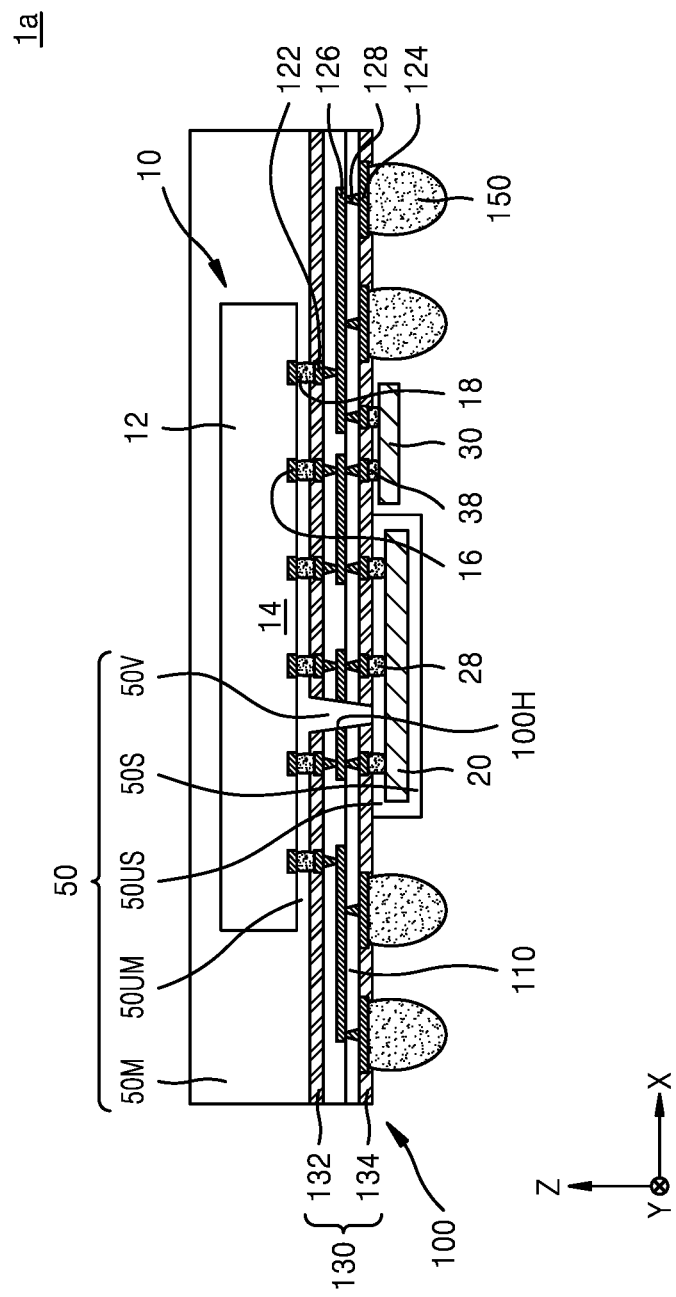
FIGS. 3A and 3B are cross-sectional views illustrating a semiconductor package according to the inventive concept.
Figure 3B:
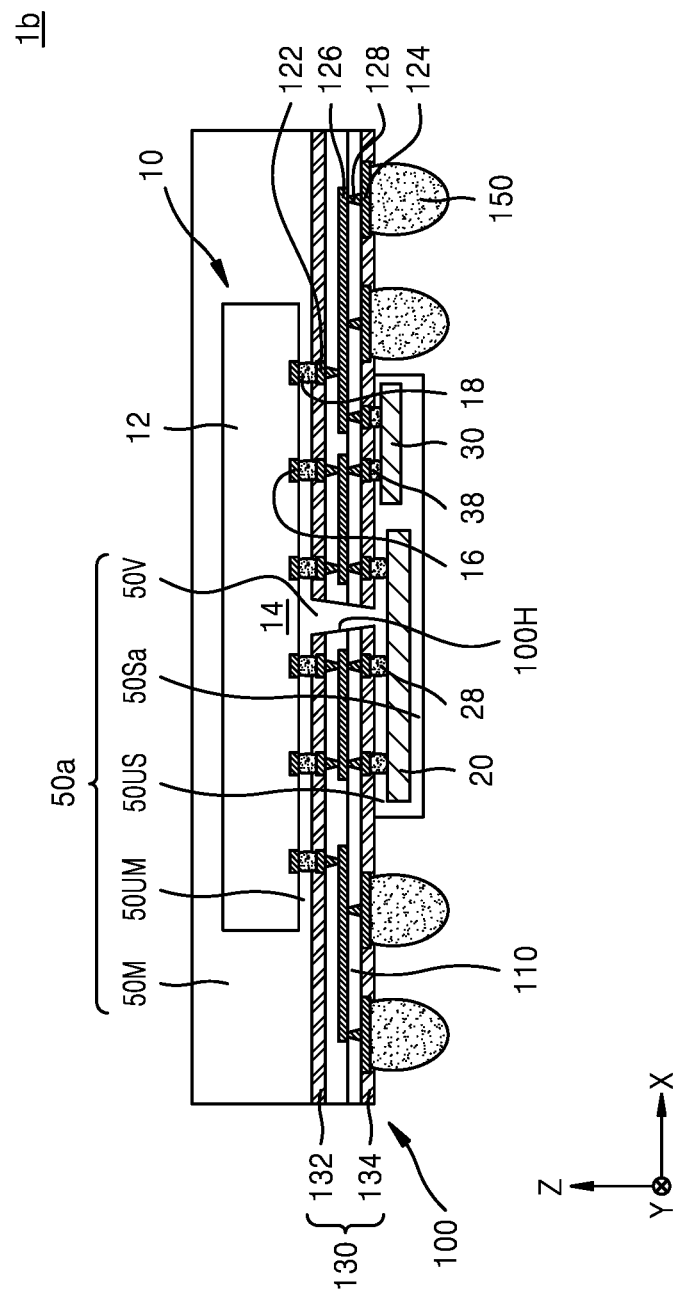

FIGS. 3A and 3B are cross-sectional views illustrating a semiconductor package according to the inventive concept. In the description given with reference to FIGS. 3A and 3B, descriptions already given with reference to FIGS. 1 to 2B may be omitted.

Referring to FIG. 3A, a semiconductor package 1a may include a package substrate 100, a semiconductor chip 10 attached to an upper surface of the package substrate 100, an auxiliary chip 20 attached to a lower surface of the package substrate 100, and an encapsulant 50 encapsulating the semiconductor chip 10 and the auxiliary chip 20. The semiconductor package 1a may further include a unit device chip 30 attached to the lower surface of the package substrate 100. The auxiliary chip 20 and the unit device chip 30 may be attached to the lower surface of the package substrate 100 while being spaced apart from each other.

The package substrate 100 may have at least one communication hole 100H extending from an upper surface of the package substrate 100 to a lower surface of the package substrate 100 and penetrating the package substrate 100. The communication hole 100H may allow a space on the upper surface of the package substrate 100 to communicate with a space on the lower surface of the package substrate 100. In some embodiments, the communication hole 100H may connect a first space between the lower surface of a semiconductor substrate 12 and an upper surface of the package substrate 100 to a second space between a lower surface of the package substrate 100 and an upper surface of the auxiliary chip 20. In some embodiments, the communication hole 100H may have a tapered shape extending from the upper surface to the lower surface of the package substrate 100 with the horizontal width of the communication hole 100H narrowing toward the lower surface of the package substrate 100.

In some embodiments, the at least one communication hole 100H may be disposed in a portion of the package substrate 100 in which the semiconductor chip 10 and the auxiliary chip 20 overlap each other in the vertical direction (Z direction) to communicate a space between the semiconductor chip 10 and the package substrate 100 and a space between the auxiliary chip 20 and the package substrate 100 with each other.

The unit device chip 30 may be a passive device or an active device. For example, the passive device may be a resistor, an inductor, or a capacitor, and the active device may be a transistor, a diode, or an operational amplifier. In some embodiments, the unit device chip 30 may be an intermediate storage capacitor (ISC). For example, the unit device chip 30 may be a ceramic capacitor or a ceramic resistor. In some embodiments, the unit device chip 30 may be a discrete chip with just one circuit element, either passive (such as resistor, capacitor, and an inductor), or active (such as a transistor, a diode, and an operational amplifier). The discrete chip as the unit device chip 30 may be provided in the form of a chip without being packaged or in the form of a package. When the unit device chip 30 is provided in the form of a package, the encapsulant 50 may not cover the unit device chip 30 as shown in FIG. 3A. When the unit device chip 30 is provided in the form of a chip, the encapsulant 50 may cover the unit device chip 30 as shown in FIG. 3B.

The unit device chip 30 may be connected to some of the plurality of lower surface pads 124 of the package substrate 100 through two or three device terminals 38. In some embodiments, a solder paste may be between the device terminal 38 of the unit device chip 30 and the substrate lower surface pad 124.

The semiconductor chip 10 may have an integrated circuit including two or more unit devices. The auxiliary chip 20 may have an integrated circuit, or may have four or more chip terminals 28. The unit device chip 30 may have two or three device terminals 38. The number of chip connecting members 18 connected to the semiconductor chip 10 may be greater than the number of chip terminals 28 connected to the auxiliary chip 20 or included in the auxiliary chip 20. The number of chip terminals 28 connected to the auxiliary chip 20 or included in the auxiliary chip 20 may be greater than the number of device terminals 38 of the unit device chip 30.

The encapsulant 50 may encapsulate the semiconductor chip 10 and the auxiliary chip 20. The encapsulant 50 may include a main encapsulation portion 50M, a main underfill portion 50UM, an auxiliary encapsulation portion 50S, an auxiliary underfill portion 50US, and a hole filling portion 50V. The main encapsulation portion 50M, the main underfill portion 50UM, the auxiliary encapsulation portion 50S, the auxiliary underfill portion 50US, and the hole filling portion 50V may be integrally formed to constitute the encapsulant 50. The encapsulant 50 may not cover the unit device chip 30. The encapsulant 50 may be formed to be spaced apart from the unit device chip 30. For example, the auxiliary encapsulation portion 50S of the encapsulant 50 may be spaced apart from the unit device chip 30.

In the semiconductor package 1a, after an encapsulation material for forming the encapsulant 50 is first injected into the upper surface of the package substrate 100, the encapsulation material is supplied to the space between the semiconductor chip 10 and the package substrate 100 and sequentially supplied along the communication hole 100H to the lower surface of the package substrate 100 to form the encapsulant 50. Thus, the semiconductor package 1a does not require an additional space for injecting the encapsulation material into the lower surface of the package substrate 100. Accordingly, the area occupied by the auxiliary chip 20 and the space for the encapsulation material injection on the lower surface of the package substrate 100 is reduced, and thus, the unit device chip 30 may be attached to the lower surface of the package substrate 100 without increasing the area of the package substrate 100 or at a minimum increase of the area of the package substrate 100.

Referring to FIG. 3B, the semiconductor package 1b may include a package substrate 100, a semiconductor chip 10 attached to an upper surface of the package substrate 100, an auxiliary chip 20 attached to a lower surface of the package substrate 100, a unit device chip 30 attached to the lower surface of the package substrate 100, and an encapsulant 50a encapsulating the semiconductor chip 10, the auxiliary chip 20, and the unit device chip 30 together. The auxiliary chip 20 and the unit device chip 30 may be attached to the lower surface of the package substrate 100 while being spaced apart from each other. The package substrate 100 may have at least one communication hole 100H extending from an upper surface of the package substrate 100 to a lower surface of the package substrate 100 and penetrating the package substrate 100.

The encapsulant 50a may encapsulate the semiconductor chip 10, the auxiliary chip 20, and the unit device chip 30. The encapsulant 50a may include a main encapsulation portion 50M, a main underfill portion 50UM, an auxiliary encapsulation portion 50Sa, an auxiliary underfill portion 50US, and a hole filling portion 50V. The auxiliary encapsulation portion 50Sa may cover the auxiliary chip 20 and the unit device chip 30 together. The encapsulant 50a may include a main underfill portion 50UM and an auxiliary underfill portion 50US that are MUF.

Figure 4:
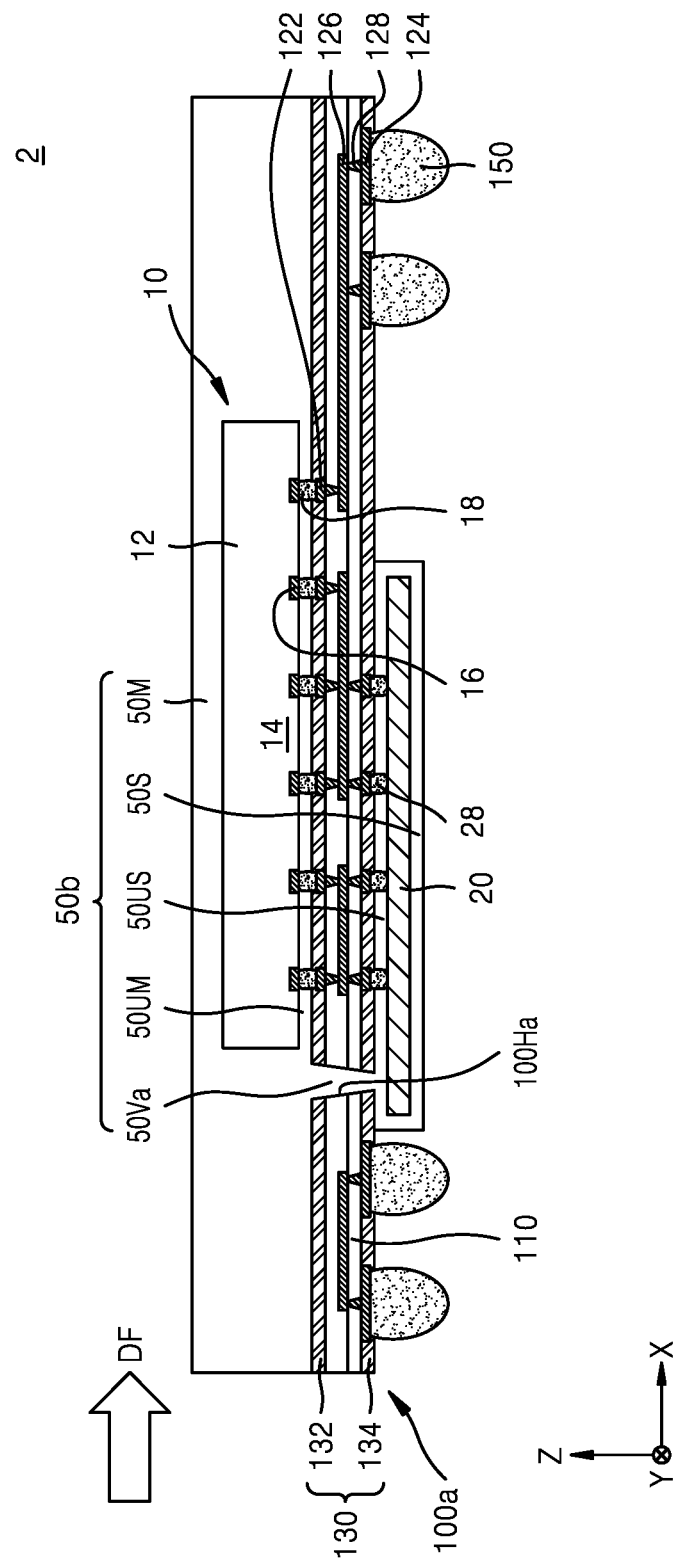
FIG. 4 is a cross-sectional view illustrating a semiconductor package according to the inventive concept.

FIG. 4 is a cross-sectional view illustrating a semiconductor package according to the inventive concept. In the description given with reference to FIG. 4, descriptions already given with reference to FIGS. 1 to 2B may be omitted.

Referring to FIG. 4, a semiconductor package 2 may include a package substrate 100a, a semiconductor chip 10 attached to an upper surface of the package substrate 100a, an auxiliary chip 20 attached to a lower surface of the package substrate 100a, and an encapsulant 50 encapsulating the semiconductor chip 10 and the auxiliary chip 20.

The package substrate 100a may have at least one communication hole 100Ha extending from an upper surface of the package substrate 100a to a lower surface of the package substrate 100a and penetrating the package substrate 100a. The communication hole 100Ha may allow a space on the upper surface of the package substrate 100a to communicate with a space on the lower surface of the package substrate 100a. In some embodiments, the communication hole 100Ha may connect a first space between the lower surface of a semiconductor substrate 12 and an upper surface of the package substrate 100a to a second space between a lower surface of the package substrate 100a and an upper surface of the auxiliary chip 20. In some embodiments, the communication hole 100Ha may have a tapered shape extending from the upper surface to the lower surface of the package substrate 100a with the horizontal width of the communication hole 100H narrowing toward the lower surface of the package substrate 100a.

In some embodiments, at least one communication hole 100Ha of the package substrate 100a may be at a position spaced apart from the lower surface of the semiconductor chip 10. For example, the at least one communication hole 100Ha may not overlap the semiconductor chip 10 in the vertical direction (Z direction). At least one communication hole 100Ha may communicate with a space on the top surface of the package substrate 100a. In some embodiments, at least one communication hole 100Ha of the package substrate 100a may be on the auxiliary chip 20. For example, all portions of the at least one communication hole 100Ha may overlap the auxiliary chip 20 in the vertical direction (Z direction). At least one communication hole 100Ha may communicate with a space between the auxiliary chip 20 and the package substrate 100a.

The encapsulant 50b may encapsulate the semiconductor chip 10 and the auxiliary chip 20. The encapsulant 50b may cover at least a portion of the upper surface of the package substrate 100a, and may cover a portion of the lower surface of the package substrate 100a. In some embodiments, the encapsulant 50b may cover all of the upper surface of the package substrate 100a, and may cover a portion of the lower surface of the package substrate 100a, but may not cover the remaining portion thereof. The encapsulant 50b may be, for example, a molding member including or being formed of an epoxy mold compound.

The encapsulant 50b may include a main encapsulation portion 50M, a main underfill portion 50UM, an auxiliary encapsulation portion 50S, an auxiliary underfill portion 50US, and a hole filling portion 50Va. The main encapsulation portion 50M, the main underfill portion 50UM, the auxiliary encapsulation portion 50S, the auxiliary underfill portion 50US, and the hole filling portion 50Va may be integrally formed to constitute the encapsulant 50b. The encapsulant 50b may include a main underfill portion 50UM and an auxiliary underfill portion 50US that are MUF.

The main encapsulation portion 50M may cover the semiconductor chip 10 on the top surface of the package substrate 100a. The main underfill portion 50UM may fill a space between the first surface (i.e., the lower surface) of the semiconductor chip 10 and the upper surface of the package substrate 100, and surround the plurality of chip connecting members 18. For example, the main underfill portion 50Um may surround each of the plurality of chip connecting members 18.

The auxiliary encapsulation portion 50S may cover the auxiliary chip 20 on the lower surface of the package substrate 100a. The auxiliary underfill portion 50US may fill a space between the upper surface of the auxiliary chip 20 and the lower surface of the package substrate 100a, and surround the plurality of chip terminals 28. For example, the auxiliary encapsulation portion 50S may surround each of the plurality of chip terminals 28. The hole filling portion 50V may fill the communication hole 100Ha.

The main encapsulation portion 50M and the main underfill portion 50UM may be connected with each other. The auxiliary encapsulation portion 50S and the auxiliary underfill portion 50US may be connected with each other. An upper end of the hole filling portion 50Va may be connected to the main encapsulation portion 50M, and a lower end thereof may be connected to the auxiliary underfill portion 50US.

In some embodiments, after attaching the semiconductor chip 10 and the auxiliary chip 20 on the upper and lower surfaces of the package substrate 100a, an encapsulation material is injected into the upper surface of the package substrate 100a in the injection direction DF, thereby forming the encapsulant 50b. After the encapsulation material is first injected into the upper surface of the package substrate 100a, a portion of the encapsulation material may be supplied to a space between the semiconductor chip 10 and the package substrate 100a, and another portion of the encapsulation material may be supplied to the lower surface of the package substrate 100a along the communication hole 100Ha, thereby forming the encapsulant 50b.

Figure 5B:
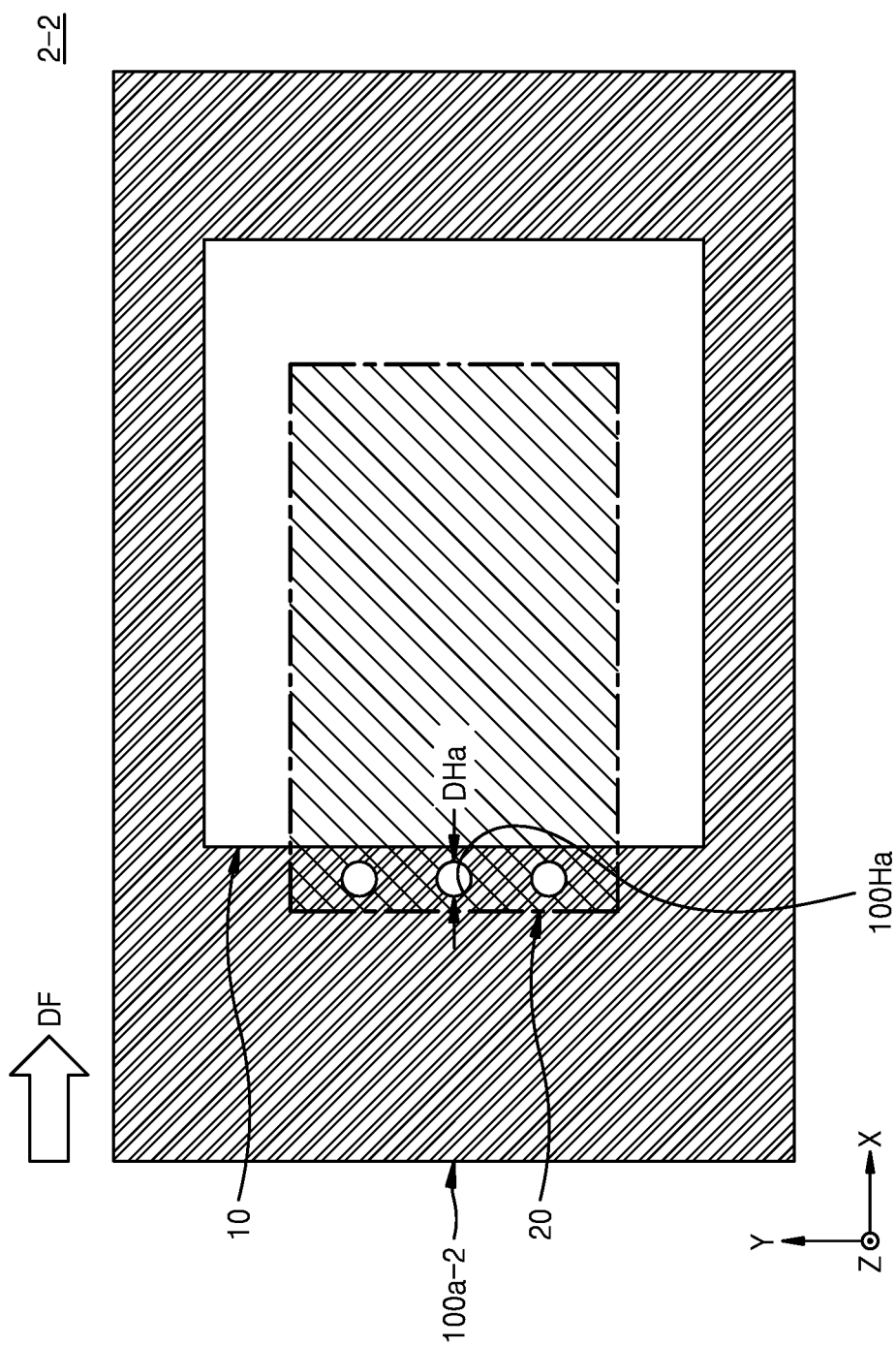

FIGS. 5A and 5B are layout views illustrating a planar arrangement of main components of a semiconductor package according to the inventive concept. For example, a cross-sectional view of each of a semiconductor package 2-1 as shown in FIG. 5A and a semiconductor package 2-2 as shown in FIG. 5B is the same as the cross-sectional view of the semiconductor package 2 as shown in FIG. 4, and in the descriptions of FIGS. 5A and 5B, FIG. 4 may also be referred to.

Referring to FIG. 5A, the semiconductor package 2-1 may include a package substrate 100a-1, a semiconductor chip 10 attached to an upper surface of a package substrate 100a-1, and an auxiliary chip 20 attached to a lower surface of the package substrate 100a-1.

The package substrate 100a-1 may have at least one communication hole 100Ha extending from an upper surface of the package substrate 100a-1 to a lower surface of the package substrate 100a-1 and penetrating the package substrate 100a-1. The communication hole 100Ha may be located at a position spaced apart from the bottom of the semiconductor chip 10. For example, the communication hole 100Ha may not overlap the semiconductor chip 10 in the vertical direction (Z direction). The communication hole 100Ha may be located on the auxiliary chip 20. For example, all portions of the communication hole 100Ha may overlap the auxiliary chip 20 in the vertical direction (Z direction).

In some embodiments, the communication hole 100Ha may be disposed in a central portion of the auxiliary chip 20 in an X-Y plane, in a central portion of the auxiliary chip 20 or in a portion adjacent to the center, in a top view. Because the semiconductor package 2-1 may include the communication hole 100Ha disposed at a central portion of the auxiliary chip 20 in the X-Y plane, an encapsulation material for forming the encapsulant 50b as shown in FIG. 4 may be supplied from a central portion of a space between the package substrate 100a-1 and the auxiliary chip 20 to the space therebetween, and thus, the encapsulant 50b may encapsulate the auxiliary chip 20 by uniformly filling the space between the package substrate 100a-1 and the auxiliary chip 20.

Referring to FIG. 5B, the semiconductor package 2-2 may include a package substrate 100a-2, a semiconductor chip 10 attached to an upper surface of a package substrate 100a-2, and an auxiliary chip 20 attached to a lower surface of the package substrate 100a-2.

The package substrate 100a-2 may have at least one communication hole 100Ha extending from an upper surface of the package substrate 100a-2 to a lower surface of the package substrate 100a-2 and penetrating the package substrate 100a-2. The communication hole 100Ha may be at a position spaced apart from the lower surface of the semiconductor chip 10. For example, the communication hole 100Ha may not overlap the semiconductor chip 10 in the vertical direction (Z direction). The communication hole 100Ha may be located on the auxiliary chip 20. For example, all portions of the communication hole 100Ha may overlap the auxiliary chip 20 in the vertical direction (Z direction).

The encapsulation material for forming the encapsulant 50b as shown in FIG. 4 may be injected in the injection direction DF. For example, the injection direction DF may be a first horizontal direction (X direction). In some embodiments, the plurality of communication holes 100Ha may be disposed in a central portion of the auxiliary chip 20 in the first horizontal direction (X direction).

In some embodiments, the plurality of communication holes 100Ha may be arranged in a row in a second horizontal direction (Y direction) orthogonal to a first horizontal direction (X direction) that is the injection direction DF.

Because the semiconductor package 2-2 has a plurality of communication holes 100Ha arranged in a row in the second horizontal direction (Y direction) orthogonal to the first horizontal direction (X direction) that is the injection direction DF, the encapsulation material may be supplied to the space between the package substrate 100a-2 and the auxiliary chip 20 through a plurality of communication holes 100Ha arranged in the row in the second horizontal direction (Y direction), and thus, the encapsulant 50b may encapsulate the auxiliary chip 20 by uniformly filling the space between the package substrate 100a-2 and the auxiliary chip 20. In some embodiments, the plurality of communication holes 100Ha may be arranged in two or more rows.

Figure 6A:
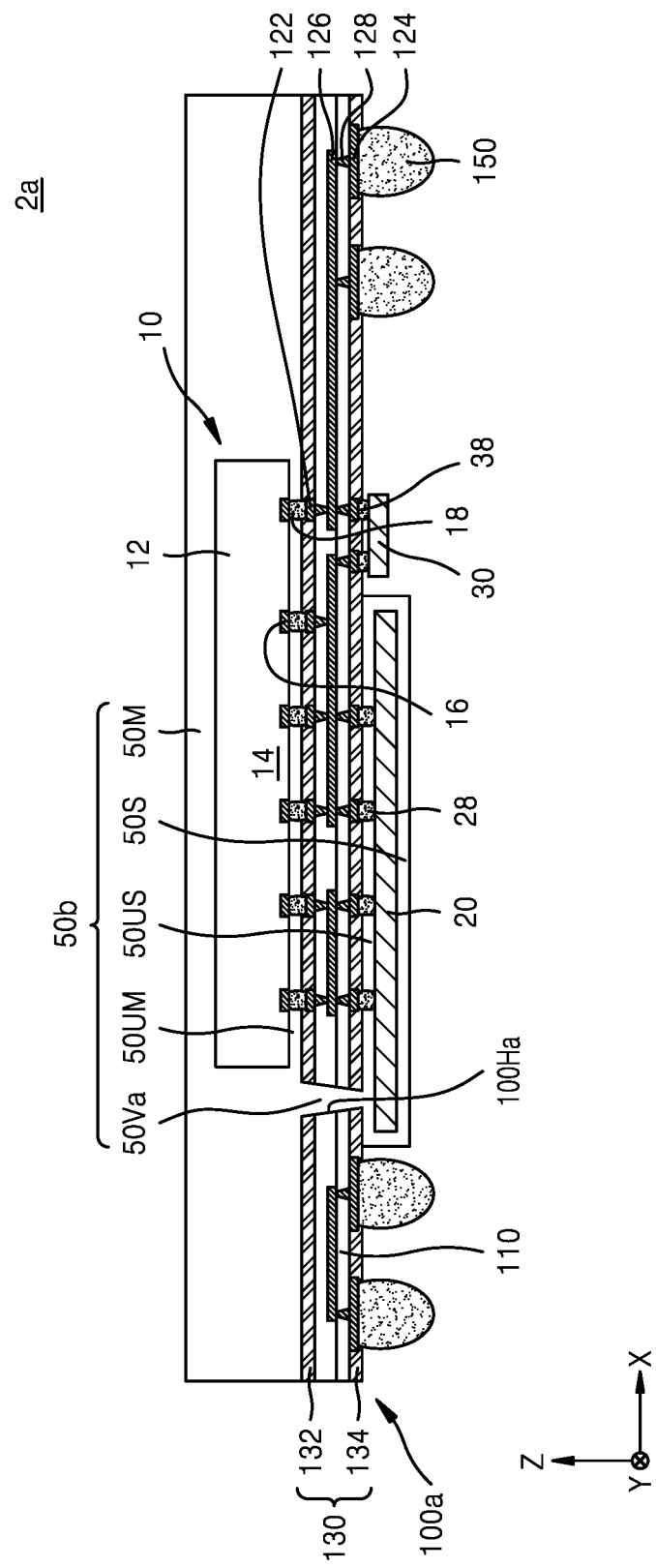
FIGS. 6A and 6B are cross-sectional views illustrating a semiconductor package according to the inventive concept.
Figure 6B:
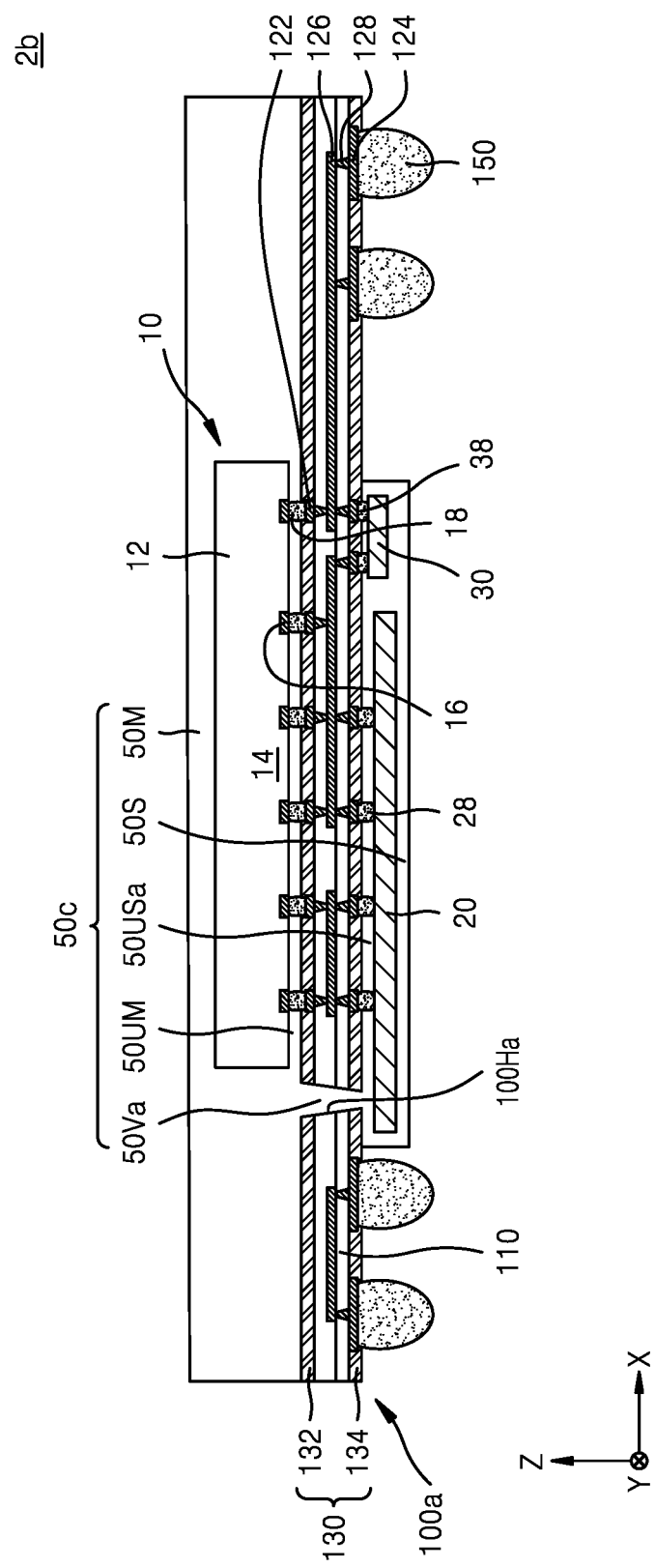

FIGS. 6A and 6B are cross-sectional views illustrating a semiconductor package according to the inventive concept. In the description given with reference to FIGS. 6A and 6B, descriptions already given with reference to FIGS. 4 to 5B may be omitted.

Referring to FIG. 6A, the semiconductor package 2a may include a package substrate 100a, a semiconductor chip 10 attached to an upper surface of the package substrate 100a, an auxiliary chip 20 attached to a lower surface of the package substrate 100a, and an encapsulant 50b encapsulating the semiconductor chip 10 and the auxiliary chip 20. The semiconductor package 2a may further include a unit device chip 30 attached to the lower surface of the package substrate 100a. The auxiliary chip 20 and the unit device chip 30 may be attached to the lower surface of the package substrate 100a while being spaced apart from each other.

The package substrate 100a may have at least one communication hole 100Ha extending from an upper surface of the package substrate 100a to a lower surface of the package substrate 100a and penetrating the package substrate 100a. The communication hole 100Ha may allow a space on the upper surface of the package substrate 100a to communicate with a space on the lower surface of the package substrate 100a. In some embodiments, the communication hole 100Ha may connect a first space between the lower surface of a semiconductor substrate 12 and an upper surface of the package substrate 100a to a second space between a lower surface of the package substrate 100a and an upper surface of the auxiliary chip 20. In some embodiments, the communication hole 100Ha may have a tapered shape extending from the upper surface to the lower surface of the package substrate 100a with the horizontal width of the communication hole 100Ha narrowing toward the lower surface of the package substrate 100a.

In some embodiments, the at least one communication hole 100Ha may be spaced apart from the lower surface of the semiconductor chip 10 in the vertical direction (Z direction) and be disposed in a portion of the package substrate 100a overlapping the auxiliary chip 20, so that the at least one communication hole 100Ha may communicate a space on the upper surface of the package substrate 100a with a space between the auxiliary chip 20 and the package substrate 100a.

The encapsulant 50b may include a main encapsulation portion 50M, a main underfill portion 50UM, an auxiliary encapsulation portion 50S, an auxiliary underfill portion 50US, and a hole filling portion 50V. The main encapsulation portion 50M, the main underfill portion 50UM, the auxiliary encapsulation portion 50S, the auxiliary underfill portion 50US, and the hole filling portion 50V may be integrally formed to constitute the encapsulant 50b. The encapsulant 50b may not cover the unit device chip 30. The encapsulant 50b may be formed to be spaced apart from the unit device chip 30. For example, the auxiliary encapsulation portion 50S of the encapsulant 50b may be spaced apart from the unit device chip 30.

In the semiconductor package 2a, after an encapsulation material for forming the encapsulant 50b is first injected into the upper surface of the package substrate 100a, a portion of the injected encapsulation material is supplied to a space between the semiconductor chip 10 and the package substrate 100a, and the other portion of the injected encapsulation material is supplied to the lower surface of the package substrate 100a along the communication hole 100Ha. Thus, the semiconductor package 2a does not require an additional space for injecting the encapsulation material into the lower surface of the package substrate 100a. Accordingly, the area occupied by the auxiliary chip 20 and the space for the encapsulation material injection on the lower surface of the package substrate 100a is reduced, and thus, the unit device chip 30 may be attached to the lower surface of the package substrate 100a without increasing the area of the package substrate 100a or at a minimum increase of the area of the package substrate 100a.

Referring to FIG. 6B, the semiconductor package 2b may include a package substrate 100a, a semiconductor chip 10 attached to an upper surface of the package substrate 100a, an auxiliary chip 20 attached to a lower surface of the package substrate 100a, a unit device chip 30 attached to the lower surface of the package substrate 100a, and an encapsulant 50c encapsulating the semiconductor chip 10, the auxiliary chip 20, and the unit device chip 30 together. The auxiliary chip 20 and the unit device chip 30 may be attached to the lower surface of the package substrate 100a while being spaced apart from each other. The package substrate 100a may have at least one communication hole 100Ha extending from an upper surface of the package substrate 100a to a lower surface of the package substrate 100a and penetrating the package substrate 100a.

The encapsulant 50c may encapsulate the semiconductor chip 10, the auxiliary chip 20, and the unit device chip 30. The encapsulant 50c may include a main encapsulation portion 50M, a main underfill portion 50UM, an auxiliary encapsulation portion 50Sa, an auxiliary underfill portion 50US, and a hole filling portion 50V. The auxiliary encapsulation portion 50Sa may cover the auxiliary chip 20 and the unit device chip 30 together. The encapsulant 50c may include a main underfill portion 50UM and an auxiliary underfill portion 50US that are MUF.

Figure 7A:
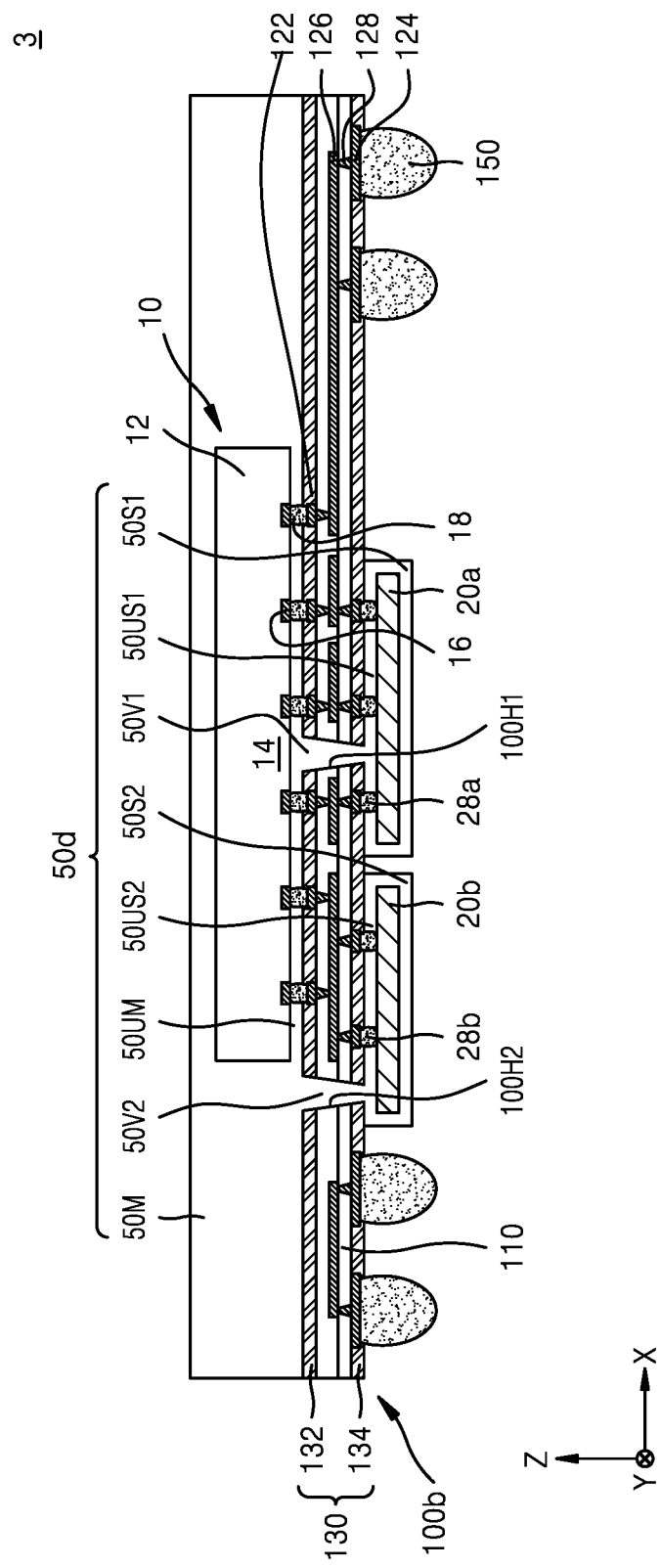
FIGS. 7A and 7B are cross-sectional views illustrating a semiconductor package according to the inventive concept.
Figure 7B:
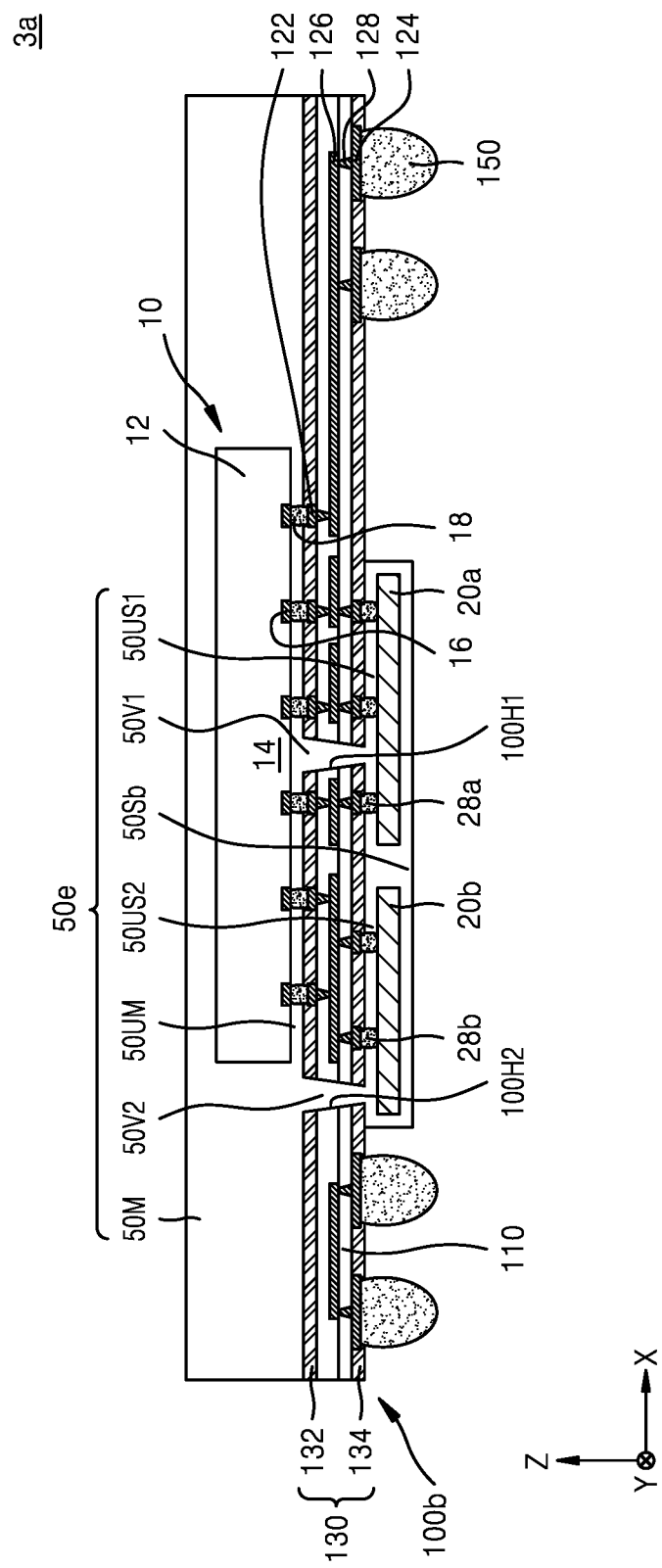

FIGS. 7A and 7B are cross-sectional views illustrating a semiconductor package according to the inventive concept. In the description given with reference to FIGS. 7A and 7B, descriptions already given with reference to FIGS. 1 to 6B may be omitted.

Referring to FIG. 7A, the semiconductor package 3 may include a package substrate 100b, a semiconductor chip 10 attached to an upper surface of the package substrate 100b, a first auxiliary chip 20a and a second auxiliary chip 20b attached to a lower surface of the package substrate 100b, and an encapsulant 50d encapsulating the semiconductor chip 10, the first auxiliary chip 20a, and the second auxiliary chip 20b. The first auxiliary chip 20a and the second auxiliary chip 20b may be attached to the lower surface of the package substrate 100b while being spaced apart from each other.

The package substrate 100b may have at least one communication hole 100H1 and at least one communication hole 100H2 extending from an upper surface of the package substrate 100b to a lower surface of the package substrate 100b and penetrating the package substrate 100b. Each of the first communication hole 100H1 and the second communication hole 100H2 may allow a space on the upper surface of the package substrate 100b to communicate with a space on the lower surface of the package substrate 100b. In some embodiments, the first communication hole 100H1 may connect a first space between the lower surface of a semiconductor substrate 12 and an upper surface of the package substrate 100b to a second space between a lower surface of the package substrate 100b and an upper surface of the first auxiliary chip 20a. In some embodiments, the second communication hole 100H2 may connect a third space adjacent to the upper surface of the package substrate 100b to a fourth space between the lower surface of the package substrate 100b and an upper surface of the second auxiliary chip 20b. In some embodiments, each of the first communication hole 100H1 and the second communication hole 100H1 and 100H2 may have a tapered shape extending from the upper surface to the lower surface of the package substrate 100b with the horizontal width of the communication hole 100H narrowing toward the lower surface of the package substrate 100b. The first communication hole 100H1 is substantially the same as the communication hole 100H as described with reference to FIGS. 1 to 3B, the second communication hole 100H2 is substantially the same as the communication hole 100Ha as described with reference to FIGS. 4 to 6A, and thus a detailed description of the first communication hole 100H1 and the second communication hole 100H2 will be omitted.

The encapsulant 50d may surround the semiconductor chip 10, the first auxiliary chip 20a, and the second auxiliary chip 20b. The encapsulant 50d may include a main encapsulation portion 50M, a main underfill portion 50UM, a first auxiliary encapsulation portion 50S1, a second auxiliary encapsulation portion 50S2, a first auxiliary underfill portion 50US1, a second auxiliary underfill portion 50US2, a first hole filling portion 50V1, and a second hole filling portion 50V2. The main encapsulation portion 50M, the main underfill portion 50UM, the first auxiliary encapsulation portion 50S1, the second auxiliary encapsulation portion 50S2, the first auxiliary underfill portion 50US1, the second auxiliary underfill portion 50US2, the first hole filling portion 50V1, and the second hole filling portion 50V2 may be integrally formed to constitute the encapsulant 50d.

The main encapsulation portion 50M may cover the semiconductor chip 10 on the top surface of the package substrate 100b. The main underfill portion 50UM may fill a space between the first surface, that is, the lower surface of the semiconductor chip 10 and the upper surface of the package substrate 100, and surround the plurality of chip connecting members 18.

The first auxiliary encapsulation portion 50S1 may cover the first auxiliary chip 20a on the lower surface of the package substrate 100b. The second auxiliary encapsulation portion 50S2 may cover the second auxiliary chip 20b on the lower surface of the package substrate 100b. The first auxiliary underfill portion 50US1 may fill a space between the upper surface of the auxiliary chip 20a and the lower surface of the package substrate 100b, and surround a plurality of first chip terminals 28a electrically connecting the first auxiliary chip 20a to the package substrate 100b. The second auxiliary underfill portion 50US2 may fill a space between the upper surface of the auxiliary chip 20b and the lower surface of the package substrate 100b, and surround a plurality of second chip terminals 28b electrically connecting the second auxiliary chip 20b to the package substrate 100b. The first hole filling portion 50V1 may fill the first communication hole 100H1. The second hole filling portion 50V2 may fill the second communication hole 100H2.

The main encapsulation portion 50M and the main underfill portion 50UM may be connected with each other. The first auxiliary encapsulation portion 50S1 and the first auxiliary underfill portion 50US1 may be connected with each other. The second auxiliary encapsulation portion 50S2 and the second auxiliary underfill portion 50US2 may be connected with each other. An upper end of the first hole filling portion 50V1 may be connected to the main underfill portion 50UM, and a lower end thereof may be connected to the first auxiliary underfill portion 50US1. An upper end of the second hole filling portion 50V2 may be connected to the main underfill portion 50UM, and a lower end thereof may be connected to the second auxiliary underfill portion 50US2. The first auxiliary encapsulation portion 50S1 and the first auxiliary underfill portion 50US1 may be spaced apart from the second auxiliary encapsulation portion 50S2 and the second auxiliary underfill portion 50US2, respectively, on the lower surface of the package substrate 100b.

Referring to FIG. 7B, the semiconductor package 3a may include a package substrate 100b, a semiconductor chip 10 attached to an upper surface of the package substrate 100b, a first auxiliary chip 20a and a second auxiliary chip 20b attached to a lower surface of the package substrate 100b, and an encapsulant 50e encapsulating the semiconductor chip 10 and the first auxiliary chip 20a and the second auxiliary chip 20b. The package substrate 100b may have at least one communication hole 100H1 and at least one communication hole 100H2 extending from an upper surface of the package substrate 100b to a lower surface of the package substrate 100b and penetrating the package substrate 100b.

The encapsulant 50e may surround the semiconductor chip 10, the first auxiliary chip 20a, and the second auxiliary chip 20b. The encapsulant 50e may include a main encapsulation portion 50M, a main underfill portion 50UM, an auxiliary encapsulation portion 50Sb, a first auxiliary underfill portion 50US1, a second auxiliary underfill portion 50US2, a first hole filling portion 50V1, and a second hole filling portion 50V2. The main encapsulation portion 50M, the main underfill portion 50UM, the auxiliary encapsulation portion 50Sb, the first auxiliary underfill portion 50US1, the second auxiliary underfill portion 50US2, the first hole filling portion 50V1, and the second hole filling portion 50V2 may be integrally formed to constitute the encapsulant 50e. The auxiliary encapsulation portion 50Sb may cover the first auxiliary chip 20a and the second auxiliary chip 20b together on the lower surface of the package substrate 100b.

The main encapsulation portion 50M and the main underfill portion 50UM may be connected with each other. The auxiliary encapsulation portion 50Sb may be connected to each of the first auxiliary underfill portion 50US1 and the second auxiliary underfill portion 50US2. An upper end of the first hole filling portion 50V1 may be connected to the main underfill portion 50UM, and a lower end thereof may be connected to the first auxiliary underfill portion 50US1. An upper end of the second hole filling portion 50V2 may be connected to the main underfill portion 50UM, and a lower end thereof may be connected to the second auxiliary underfill portion 50US2.

Figure 8A:
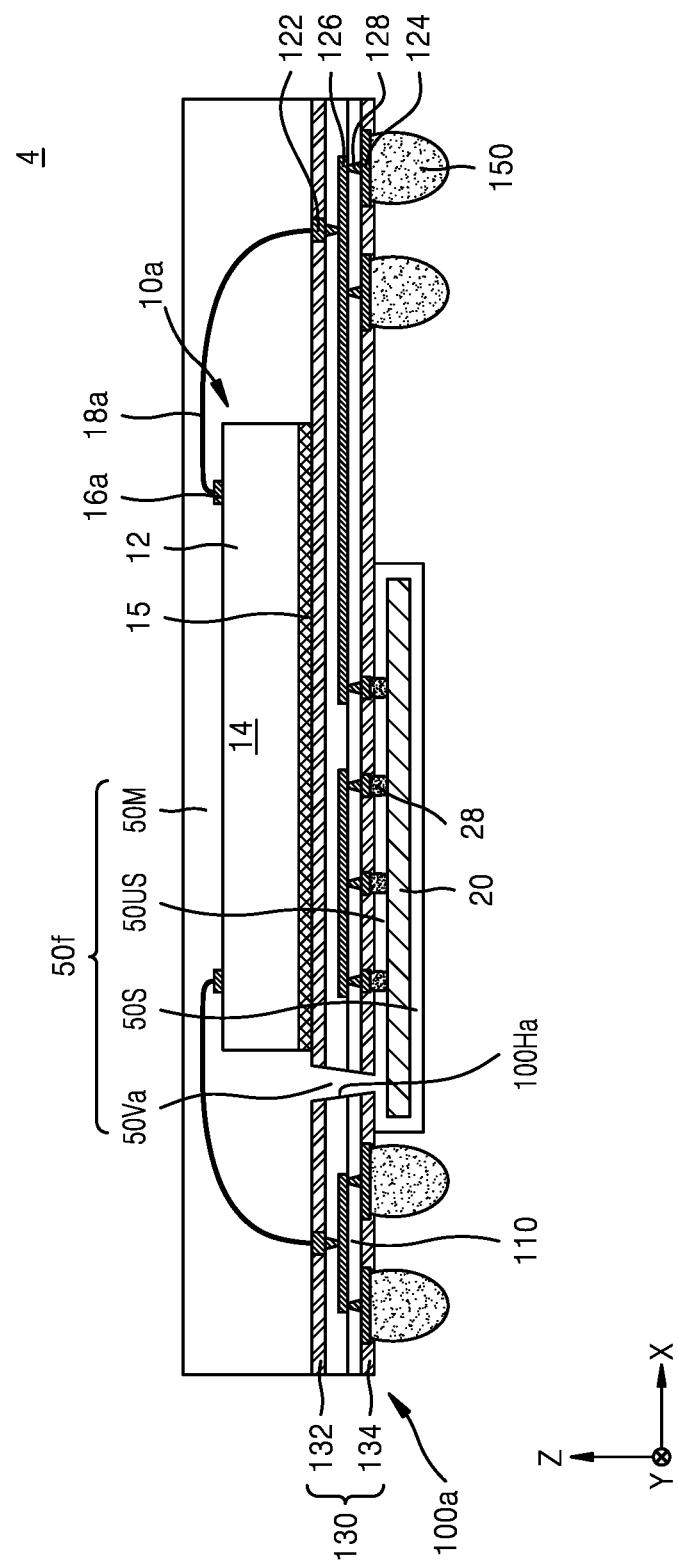
FIGS. 8A to 8C are cross-sectional views illustrating a semiconductor package according to the inventive concept.
Figure 8B:
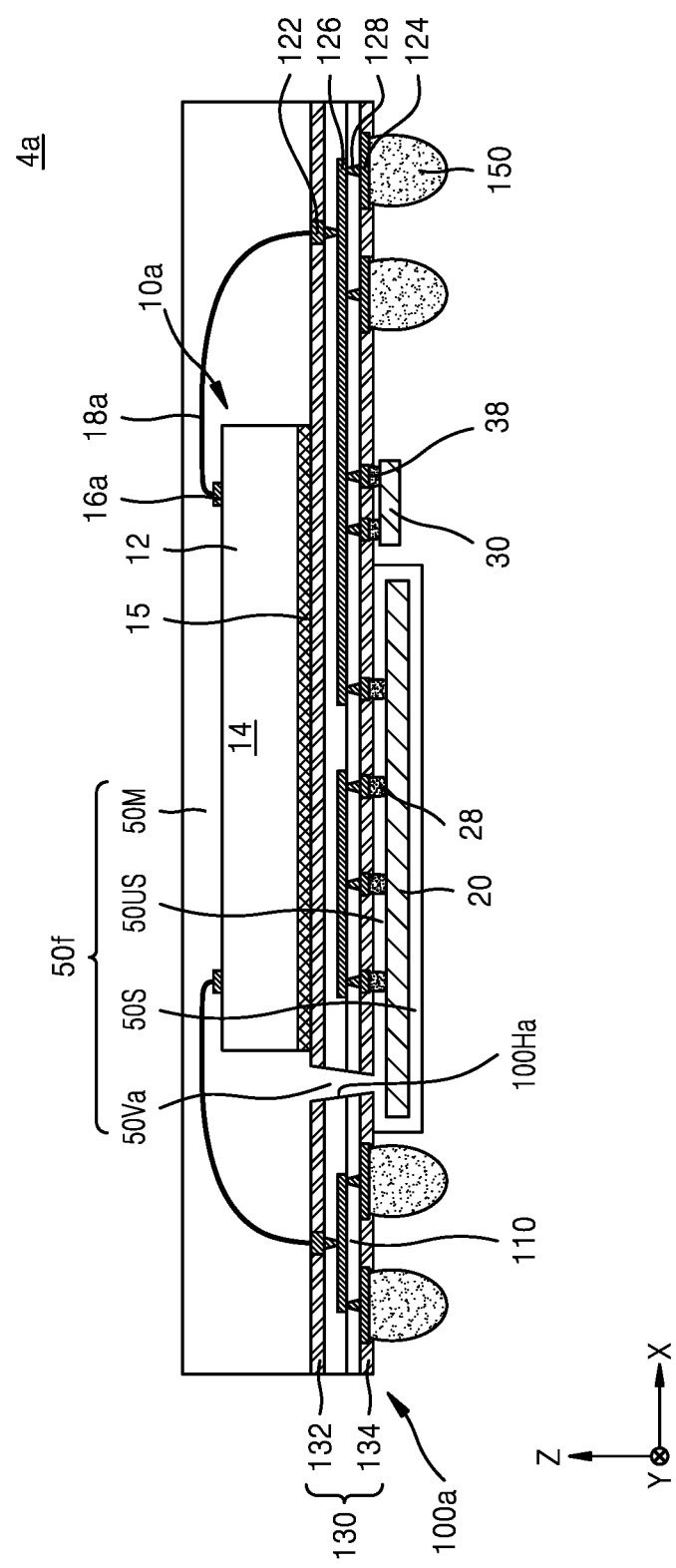
Figure 8C:
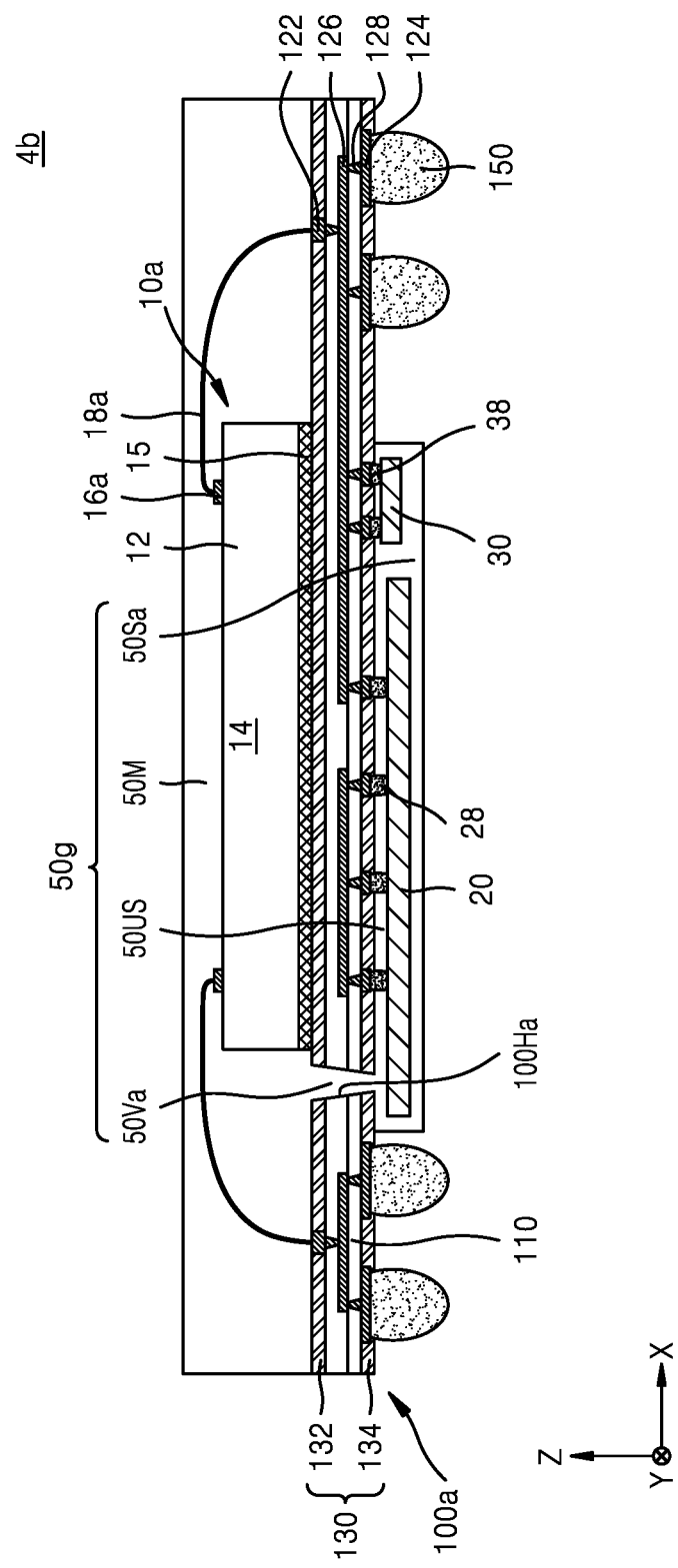

FIGS. 8A to 8C are cross-sectional views illustrating a semiconductor package according to the inventive concept. In the description given with reference to FIGS. 8A to 8C, descriptions already given with reference to FIGS. 1 to 7B may be omitted.

Referring to FIG. 8A, the semiconductor package 4 may include a package substrate 100a, a semiconductor chip 10a attached to an upper surface of the package substrate 100a, an auxiliary chip 20 attached to a lower surface of the package substrate 100a, and an encapsulant 50f encapsulating the semiconductor chip 10a and the auxiliary chip 20.

The semiconductor chip 10a may include a semiconductor substrate 12 having an active surface and an inactive surface opposite to each other, a semiconductor device 14 formed at the active surface of the semiconductor substrate 12, and a plurality of chip pads 16a disposed on a first surface of the semiconductor chip 10.

In some embodiments, the semiconductor chip 10a has a face-up arrangement in which a second surface opposite to the first surface faces the package substrate 100a, and may be attached to the upper surface of the package substrate 100a. In this case, the first surface of the semiconductor chip 10a may be referred to as an upper surface of the semiconductor chip 10a, and the second surface of the semiconductor chip 10a may be referred to as a lower surface of the semiconductor chip 10a. The semiconductor chip 10a has a die adhesive film 15 attached to the second surface and may be attached to the upper surface of the package substrate 100a. A plurality of chip connecting members 18a may be connected between the plurality of chip pads 16a of the semiconductor chip 10a and a plurality of substrate upper surface pads 122 of the package substrate 100a, respectively. For example, the chip connecting member 18a may be a bonding wire. The semiconductor chip 10a and the package substrate 100a may be electrically connected with each other through the plurality of chip connecting members 18a.

The package substrate 100a may have at least one communication hole 100Ha extending from an upper surface of the package substrate 100a to a lower surface of the package substrate 100a and penetrating the package substrate 100a. In some embodiments, at least one communication hole 100Ha of the package substrate 100a may be at a position spaced apart from the lower surface of the semiconductor chip 10. In some embodiments, at least one communication hole 100Ha of the package substrate 100a may be on the auxiliary chip 20.

The encapsulant 50f may encapsulate the semiconductor chip 10a and the auxiliary chip 20. The encapsulant 50f may cover at least a portion of the upper surface of the package substrate 100a, and may cover a portion of the lower surface of the package substrate 100a. The encapsulant 50f may include a main encapsulation portion 50M, an auxiliary encapsulation portion 50S, an auxiliary underfill portion 50US, and a hole filling portion 50Va. The main encapsulation portion 50M, the auxiliary encapsulation portion 50S, the auxiliary underfill portion 50US, and the hole filling portion 50Va may be integrally formed to constitute the encapsulant 50f.

Referring to FIG. 8B, the semiconductor package 4a may include a package substrate 100a, a semiconductor chip 10a attached to an upper surface of the package substrate 100a, an auxiliary chip 20 attached to a lower surface of the package substrate 100a, and an encapsulant 50f encapsulating the semiconductor chip 10a and auxiliary chip 20. The semiconductor package 4a may further include a unit device chip 30 attached to the lower surface of the package substrate 100a. The package substrate 100a may have at least one communication hole 100Ha extending from an upper surface of the package substrate 100a to a lower surface of the package substrate 100a and penetrating the package substrate 100a.

The encapsulant 50f may include a main encapsulation portion 50M, an auxiliary encapsulation portion 50S, an auxiliary underfill portion 50US, and a hole filling portion 50Va. The main encapsulation portion 50M, the auxiliary encapsulation portion 50S, the auxiliary underfill portion 50US, and the hole filling portion 50Va may be integrally formed to constitute the encapsulant 50f. The encapsulant 50f may not cover the unit device chip 30. The encapsulant 50f may be formed to be spaced apart from the unit device chip 30. For example, the auxiliary encapsulation portion 50S of the encapsulant 50f may be spaced apart from the unit device chip 30.

Referring to FIG. 8C, the semiconductor package 4b may include a package substrate 100a, a semiconductor chip 10a attached to an upper surface of the package substrate 100a, an auxiliary chip 20 attached to a lower surface of the package substrate 100a, a unit device chip 30 attached to the lower surface of the package substrate 100a, and an encapsulant 50g encapsulating the semiconductor chip 10, the auxiliary chip 20, and the unit device chip 30 together. The auxiliary chip 20 and the unit device chip 30 may be attached to the lower surface of the package substrate 100a while being spaced apart from each other. The package substrate 100a may have at least one communication hole 100Ha extending from an upper surface of the package substrate 100a to a lower surface of the package substrate 100a and penetrating the package substrate 100a.

The encapsulant 50g may surround the semiconductor chip 10a, the auxiliary chip 20, and the unit device chip 30. The encapsulant 50g may include a main encapsulation portion 50M, an auxiliary encapsulation portion 50Sa, an auxiliary underfill portion 50US, and a hole filling portion 50V. The auxiliary encapsulation portion 50Sa may cover the auxiliary chip 20 and the unit device chip 30 together.

Figure 9A:
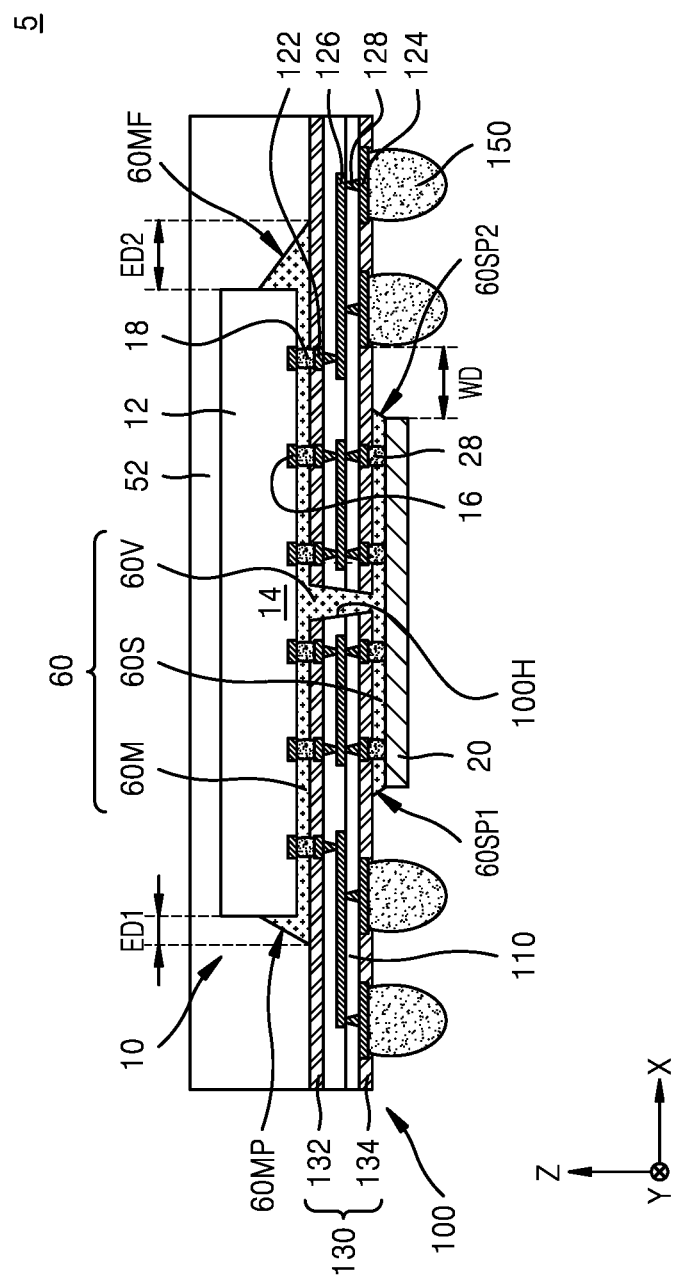
FIGS. 9A and 9B are cross-sectional views illustrating a semiconductor package according to the inventive concept.
Figure 9B:
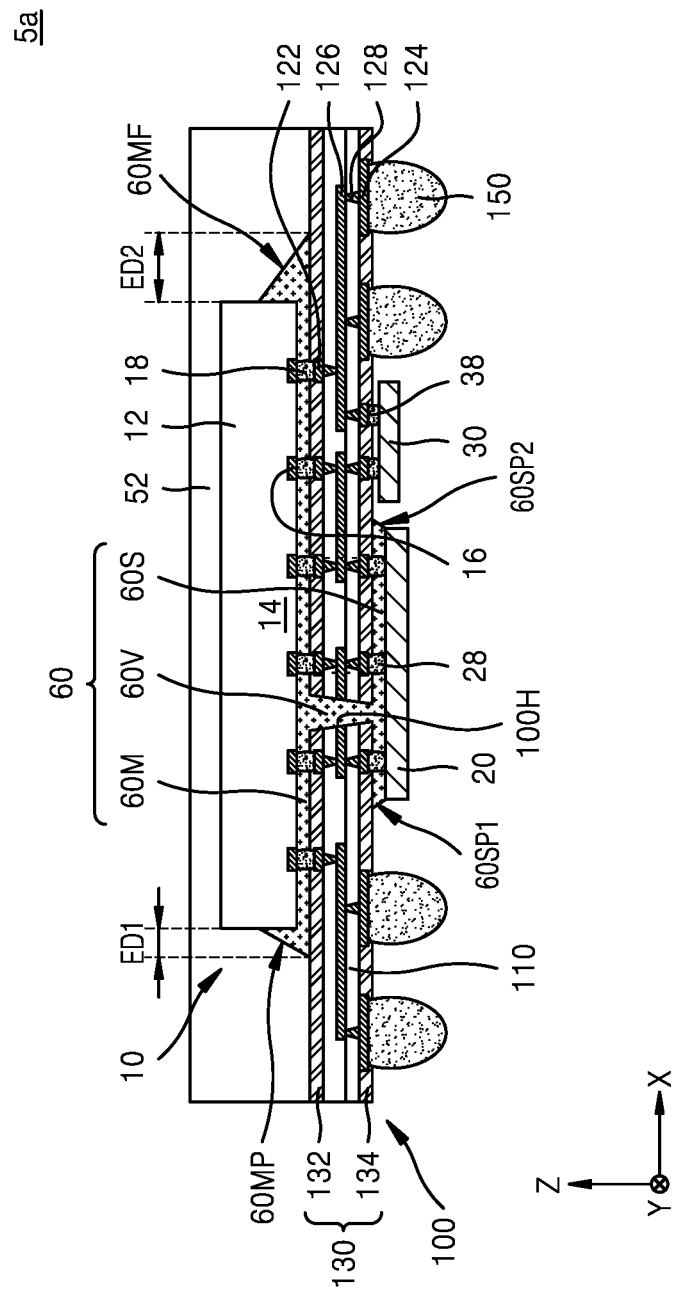

FIGS. 9A and 9B are cross-sectional views illustrating a semiconductor package according to the inventive concept. In the description given with reference to FIGS. 9A and 9B, descriptions already given with reference to FIGS. 1 to 2B may be omitted.

Referring to FIG. 9A, the semiconductor package 5 may include a package substrate 100, a semiconductor chip 10 attached to an upper surface of the package substrate 100, an auxiliary chip 20 attached to a lower surface of the package substrate 100, and a first encapsulant 52 encapsulating the semiconductor chip 10. The package substrate 100 may have at least one communication hole 100H extending from an upper surface of the package substrate 100 to a lower surface of the package substrate 100 and penetrating the package substrate 100.

The semiconductor package 5 may further include a second encapsulant 60 filling a space between the upper surface of the package substrate 100 and the lower surface of the semiconductor chip 10, a space between the lower surface of the package substrate 100 and an upper surface of the auxiliary chip 20, and the at least one communication hole 100H.

The second encapsulant 60 may include a main underfill portion 60M, an auxiliary underfill portion 60S, and a hole filling portion 60V. The main underfill portion 60M may fill a space between the first surface (i.e., the lower surface) of the semiconductor chip 10 and the upper surface of the package substrate 100, and surround the plurality of chip connecting members 18. The auxiliary underfill portion 60S may fill a space between the upper surface of the auxiliary chip 20 and the lower surface of the package substrate 100, and surround the plurality of chip terminals 28. The hole filling portion 60V may fill the communication hole 100H.

The first encapsulant 52 may encapsulate the semiconductor chip 10 and the main underfill portion 60M of the second encapsulant 60 on the upper surface of the package substrate 100. The first encapsulant 52 and the second encapsulant 60 may be formed separately, so that the interface between the first encapsulant 52 and the second encapsulant 60 may be formed.

An upper end of the hole filling portion 60V may be connected to the main underfill portion 60M, and a lower end thereof may be connected to the auxiliary underfill portion 60S. Each of the main underfill portion 60M, the auxiliary underfill portion 60S, and the hole filling portion 60V may be referred to as distinguishing portions of the second encapsulant 60. Each name of the distinguishing portions may represent a position at which each distinguishing portion is disposed in the encapsulant 60 for the convenience of description. The main underfill portion 60M, the auxiliary underfill portion 60S, and the hole filling portion 60V may be integrally formed by a single manufacturing process to form the encapsulant 60. The second encapsulant 60 may be made of, for example, a resin material formed by a capillary underfill method.

The main underfill portion 60M may have a first main protrusion 60MP and a second main protrusion 60MF protruding outward from a space between the lower surface of the semiconductor chip 10 and the upper surface of the package substrate 100. The first main protrusion 60MP has a first extension length ED1 in a horizontal direction (X direction or Y direction), and the second main protrusion 60MF may have a second extension length ED2 in a horizontal direction (X direction or Y direction). For example, the first main protrusion 60MP may be formed at a first end of the space between the lower surface of the semiconductor chip 10 and the upper surface of the package substrate 100, and the second main protrusion 60MF may be formed at a second end, opposite to the first end, of the space between the lower surface of the semiconductor chip 10 and the upper surface of the package substrate 100. Each of the first extension length ED1 and the second extension length ED2 may be a length in which each of the first main protrusion 60MP and the second main protrusion 60MF extends outward from a corresponding side surface of the semiconductor chip 10. In FIG. 9A, each of the first main protrusion 60MP and the second main protrusion 60MF is illustrated to extend in the first horizontal direction (X direction), but this is exemplary and not limited thereto. In some embodiments, each of the first main protrusion 60MP and the second main protrusion 60MF may extend in the second horizontal direction (Y direction), which is the front-back direction with respect to FIG. 9A.

The second encapsulant 60 may be formed by dispensing an underfill material from the side of the second main protrusion 60MF. The second extended length ED2 may have a greater value than the first extended length ED1. In the second encapsulant 60, the underfill material applied from the side of the second main protrusion 60MF fills between the lower surface of the semiconductor chip 10 and the upper surface of the package substrate 100, and may also fill a space between the upper surface of the auxiliary chip 20 and the lower surface of the package substrate 100 through the communication hole 100H.

The auxiliary underfill portion 60S may have a first auxiliary protrusion 60SP1 and a second auxiliary protrusion 60SP2 exposed to the outside from a space between the lower surface of the package substrate 100 and the auxiliary chip 20. Each of the first auxiliary protrusion 60SP1 and the second auxiliary protrusion 60SP2 may have substantially the same extension length in the horizontal direction (X direction or Y direction).

In the semiconductor package 5, after an underfill material for forming the second encapsulant 60 is first applied to the upper surface of the package substrate 100, the underfill material is supplied to the space between the semiconductor chip 10 and the package substrate 100 and sequentially supplied along the communication hole 100H to the lower surface of the package substrate 100 to form the second encapsulant 60. Thus, the semiconductor package 5 does not require an additional space for applying the underfill material to the lower surface of the package substrate 100. Therefore, a separation distance WD between the auxiliary chip 20 and the plurality of external connection terminals 150 may be reduced, thereby minimizing a horizontal area of the semiconductor package 5, and thus, the size of the semiconductor package 5, that is, a form factor, may be reduced.

Referring to FIG. 9B, the semiconductor package 5a may include a package substrate 100, a semiconductor chip 10 attached to an upper surface of the package substrate 100, an auxiliary chip 20 attached to a lower surface of the package substrate 100, and a first encapsulant 52 encapsulating the semiconductor chip 10 and the auxiliary chip 20. The package substrate 100 may have at least one communication hole 100H extending from an upper surface of the package substrate 100 to a lower surface of the package substrate 100 and penetrating the package substrate 100. The semiconductor package 5a may further include a second encapsulant 60 filling a space between the upper surface of the package substrate 100 and the lower surface of the semiconductor chip 10, a space between the lower surface of the package substrate 100 and the lower surface of the auxiliary chip 20, and the at least one communication hole 100H.

The semiconductor package 5a may further include a unit device chip 30 attached to the lower surface of the package substrate 100. The auxiliary chip 20 and the unit device chip 30 may be attached to the lower surface of the package substrate 100 while being spaced apart from each other. The second encapsulant 60 may be formed to be spaced apart from the unit device chip 30.

In the semiconductor package 5a, after an underfill material for forming the second encapsulant 60 is first applied to the upper surface of the package substrate 100, the underfill material is supplied to the space between the semiconductor chip 10 and the package substrate 100 and sequentially supplied along the communication hole 100H to the lower surface of the package substrate 100 to form the second encapsulant 60. Thus, the semiconductor package 5a does not require an additional space for applying the underfill material to the lower surface of the package substrate 100. Accordingly, the area occupied by the auxiliary chip 20 and the space for the underfill material injection on the lower surface of the package substrate 100 is reduced, and thus the unit device chip 30 may be attached to the lower surface of the package substrate 100 without increasing the area of the package substrate 100 or at a minimum increase of the area of the package substrate 100.

Figure 10:
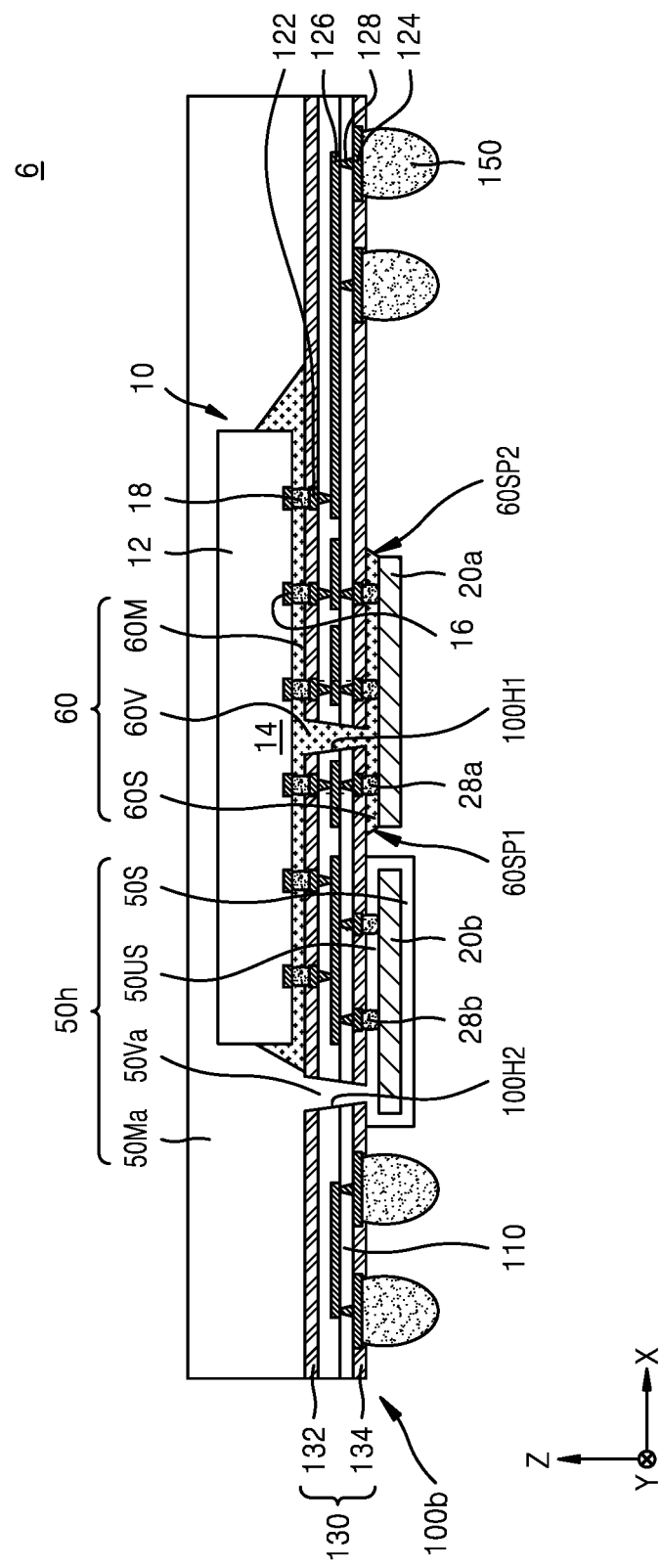
FIG. 10 is a cross-sectional view illustrating a semiconductor package according to the inventive concept.

FIG. 10 is a cross-sectional view illustrating a semiconductor package according to the inventive concept. In the description given with reference to FIG. 10, descriptions already given with reference to FIGS. 1 to 9B may be omitted.

Referring to FIG. 10, the semiconductor package 6 may include a package substrate 100b, a semiconductor chip 10 attached to an upper surface of the package substrate 100b, a first auxiliary chip 20a and a second auxiliary chip 20b attached to a lower surface of the package substrate 100, and a first encapsulant 50h encapsulating the first semiconductor chip 10 and the auxiliary chip 20b. The first auxiliary chip 20a and the second auxiliary chip 20b may be attached to the lower surface of the package substrate 100b while being spaced apart from each other. The package substrate 100b may have at least one communication hole 100H1 and at least one communication hole 100H2 extending from an upper surface of the package substrate 100b to a lower surface of the package substrate 100b and penetrating the package substrate 100b. Each of the first communication hole 100H1 and the second communication hole 100H2 may allow a space on the upper surface of the package substrate 100b to communicate with a space on the lower surface of the package substrate 100b. In some embodiments, the first communication hole 100H1 may connect a first space between the lower surface of a semiconductor substrate 12 and an upper surface of the package substrate 100b to a second space between a lower surface of the package substrate 100b and an upper surface of the first auxiliary chip 20a. In some embodiments, the second communication hole 100H2 may connect a third space adjacent to the upper surface of the package substrate 100b to a fourth space between the lower surface of the package substrate 100b and an upper surface of the second auxiliary chip 20b.

The semiconductor package 6 may further include a second encapsulant 60 filling a space between the upper surface of the package substrate 100b and the lower surface of the semiconductor chip 10, a space between the lower surface of the package substrate 100b and the lower surface of the auxiliary chip 20a, and the at least one communication hole 100H1. The second encapsulant 60 may include a main underfill portion 60M, a first auxiliary underfill portion 60S, and a hole filling portion 60V. The main underfill portion 60M may fill a space between the first surface (i.e., the lower surface) of the semiconductor chip 10 and the upper surface of the package substrate 100, and surround the plurality of chip connecting members 18. The auxiliary underfill portion 60S may fill a space between the upper surface of the first auxiliary chip 20a and the lower surface of the package substrate 100b, and surround the plurality of chip terminals 28a. The first hole filling portion 60V may fill the communication hole 100H.

The first encapsulant 50h may include a main encapsulation portion 50Ma, an auxiliary encapsulation portion 50S, a second auxiliary underfill portion 50US, and a second hole filling portion 50Va. The main encapsulation portion 50Ma, the auxiliary encapsulation portion 50S, the second auxiliary underfill portion 50US, and the second hole filling portion 50Va may be integrally formed to constitute the first encapsulant 50h. The main encapsulation portion 50Ma may cover the semiconductor chip 10 and the main underfill portion 60M of the second encapsulant 60 on the upper surface of the package substrate 100b. The auxiliary encapsulation portion 50S may cover the second auxiliary chip 20b on the lower surface of the package substrate 100b. The second auxiliary underfill portion 50US may fill a space between the upper surface of the second auxiliary chip 20b and the lower surface of the package substrate 100b, and surround the plurality of second chip terminals 28b. The second hole filling portion 50Va may fill the second communication hole 100H2. The auxiliary encapsulation portion 50S and the second auxiliary underfill portion 50US may be spaced apart from the first auxiliary underfill portion 60S on the lower surface of the package substrate 100b.

In some embodiments, the auxiliary encapsulation portion 50S may cover the first auxiliary chip 20a, the first auxiliary underfill portion 60S, and the second auxiliary chip 20b together, similarly to the auxiliary encapsulation portion 50Sb as shown in FIG. 7B.

Figure 11:
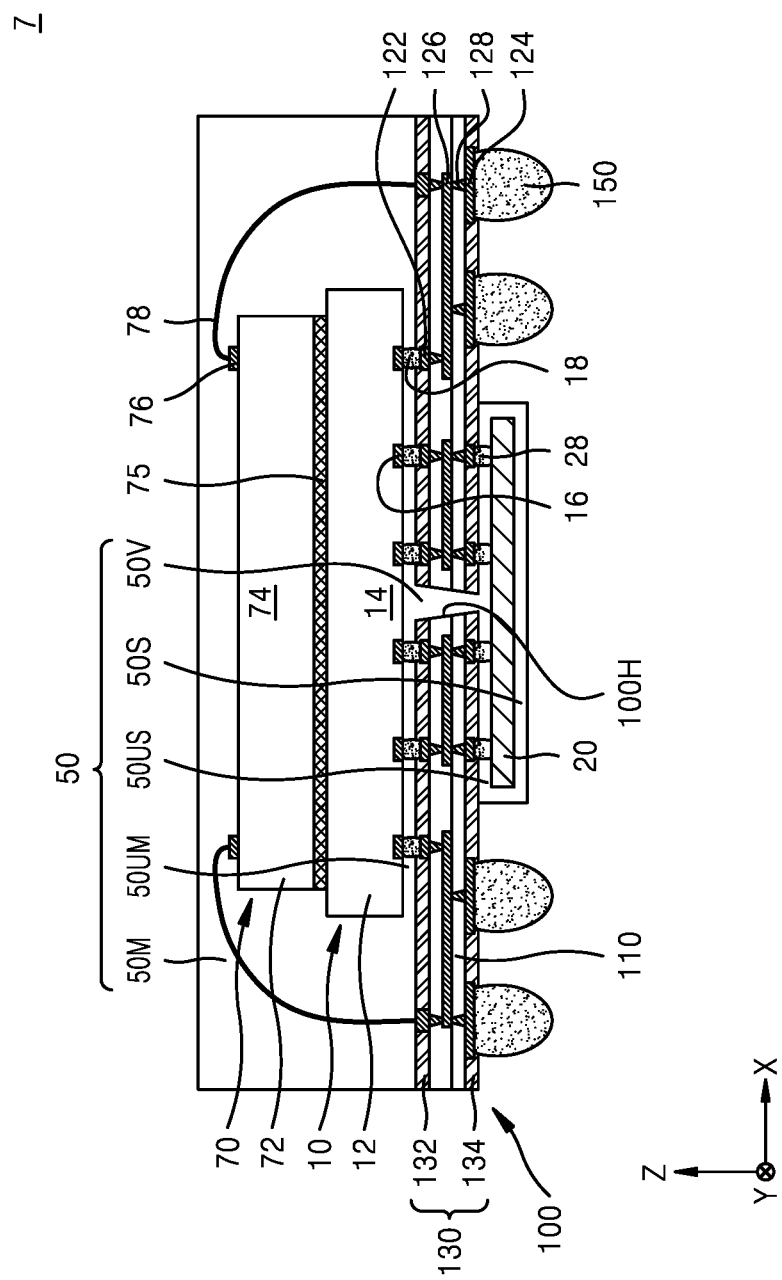
FIG. 11 is a cross-sectional view illustrating a semiconductor package according to the inventive concept.

FIG. 11 is a cross-sectional view illustrating a semiconductor package according to the inventive concept. In the description given with reference to FIG. 11, descriptions already given with reference to FIGS. 1 to 8C may be omitted.

Referring to FIG. 11, the semiconductor package 7 may include a package substrate 100, a first semiconductor chip 10 attached to an upper surface of the package substrate 100, a second semiconductor chip 70 attached to the first semiconductor chip 10, an auxiliary chip 20 attached to a lower surface of the package substrate 100, and an encapsulant 50 encapsulating the first semiconductor chip 10, the second semiconductor chip 70, and the auxiliary chip 20.

The first semiconductor chip 10 may include a first semiconductor substrate 12 having an active surface and an inactive surface opposite to each other, a first semiconductor device 14 formed at the active surface of the first semiconductor substrate 12, and a plurality of first chip pads 16 disposed on a first surface of the first semiconductor chip 10. The first semiconductor chip 10 and the package substrate 100 may be electrically connected with each other through a plurality of first chip connecting members 18. The first semiconductor chip 10 may be the semiconductor chip 10 shown in FIG. 1.

The second semiconductor chip 70 may include a second semiconductor substrate 72 having an active surface and an inactive surface opposite to each other, a second semiconductor device 74 formed at the active surface of the second semiconductor substrate 72, and a plurality of second chip pads 76 disposed on a first surface of the second semiconductor chip 70.

In some embodiments, the second semiconductor chip 70 may have a face-up arrangement in which a second surface opposite to the first surface faces the first semiconductor chip 10, and may be attached to an upper surface of the first semiconductor chip 10. The second semiconductor chip 70 may have a die adhesive film 75 attached to the second surface and may be attached to the upper surface of the first semiconductor chip 10. A plurality of second chip connecting members 78 may be connected between a plurality of second chip pads 76 of the second semiconductor chip 70 and a plurality of substrate upper surface pads 122 of the package substrate 100. For example, the second chip connecting member 78 may be a bonding wire. The second semiconductor chip 70 and the package substrate 100 may be electrically connected with each other through a plurality of second chip connection members 78.

The semiconductor package 7 is illustrated as the semiconductor package 1 as shown in FIG. 1 with the second semiconductor chip 70, but may also be as the semiconductor packages 1-1, 1-2, 1a, 1b, 2, 2b, 2-1, 2-2, 2a, 2b, 3, 3a, 4, 4a, and 4b as shown in FIGS. 2A, 2B, 3A, 3B, 4, 5A, 5B, 6A, 6B, 7A, 7B, 8A, 8B, and 8C, respectively, with the second semiconductor chip 70.

Figure 12:
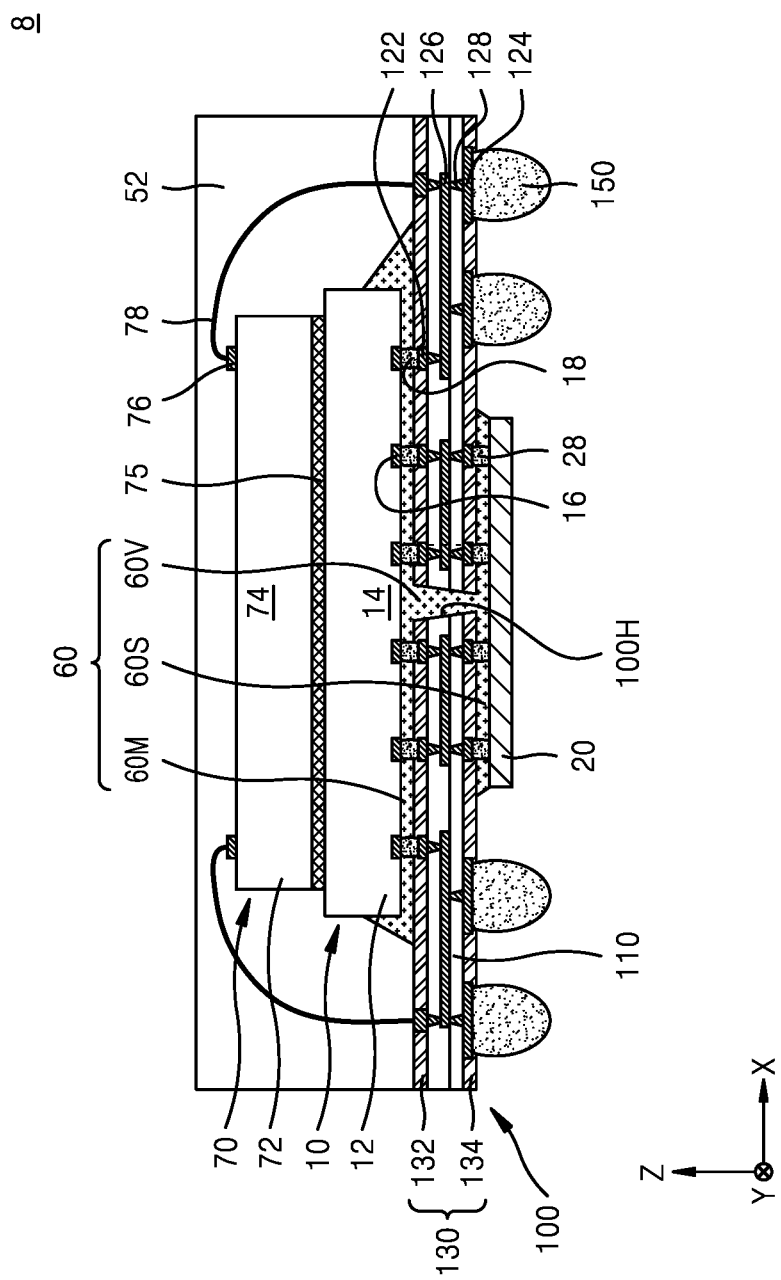
FIG. 12 is a cross-sectional view illustrating a semiconductor package according to the inventive concept.

FIG. 12 is a cross-sectional view illustrating a semiconductor package according to the inventive concept. In the description given with reference to FIG. 12, descriptions already given with reference to FIGS. 9A to 11 may be omitted.

Referring to FIG. 12, the semiconductor package 8 may include a package substrate 100, a first semiconductor chip 10 attached to an upper surface of the package substrate 100, a second semiconductor chip 70 attached to the first semiconductor chip 10, an auxiliary chip 20 attached to a lower surface of the package substrate 100, and a first encapsulant 52 encapsulating the first semiconductor chip 10 and the second semiconductor chip 70. The package substrate 100 may have at least one communication hole 100H extending from an upper surface of the package substrate 100 to a lower surface of the package substrate 100 and penetrating the package substrate 100. The semiconductor package 8 may further include a second encapsulant 60 filling a space between the upper surface of the package substrate 100 and the lower surface of the first semiconductor chip 10, a space between the lower surface of the package substrate 100 and the lower surface of the auxiliary chip 20, and the at least one communication hole 100H1.

The second semiconductor chip 70 may have a die adhesive film 75 attached to the second surface and may be attached to the upper surface of the first semiconductor chip 10. A plurality of second chip connecting members 78 may be connected between a plurality of second chip pads 76 of the second semiconductor chip 70 and a plurality of substrate upper surface pads 122 of the package substrate 100. For example, the second chip connecting member 78 may be a bonding wire.

The semiconductor package 8 is illustrated as the semiconductor package 5 as shown in FIG. 9A with the second semiconductor chip 70, but may also be as the semiconductor packages 5a and 6 as shown in FIGS. 9B and 10 with the second semiconductor chip 70.

Figure 13:
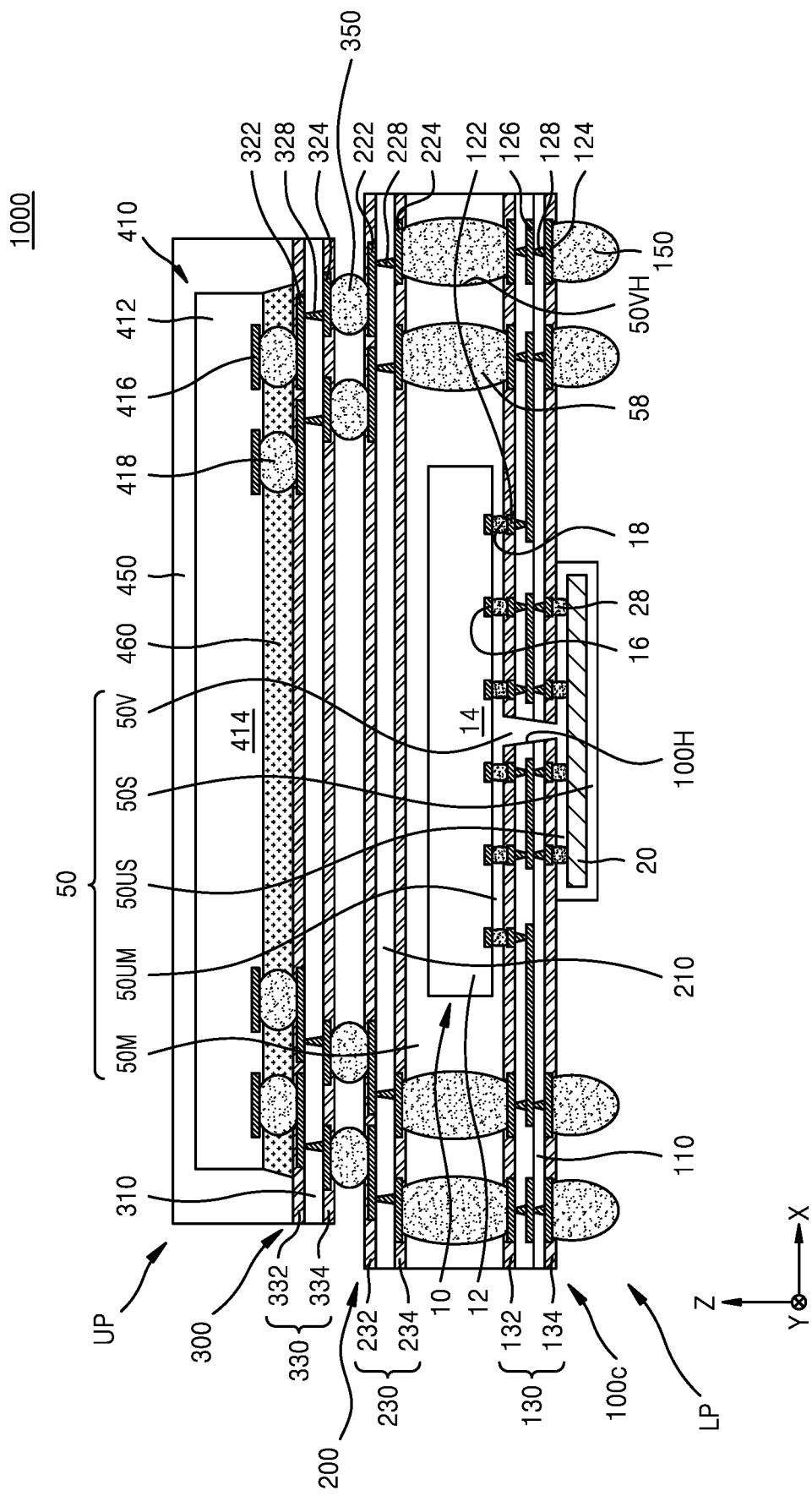
FIG. 13 is a cross-sectional view of a semiconductor package in the form of a package on package (PoP) according to embodiments of the inventive concept.

FIG. 13 is a cross-sectional view of a semiconductor package in the form of a package on package (PoP) according to embodiments of the inventive concept. In the description given with reference to FIG. 13, descriptions already given with reference to FIGS. 1 to 8C may be omitted.

Referring to FIG. 13, a semiconductor package 1000 may be a package on package (PoP) type semiconductor package in which an upper package UP is attached on a lower package LP.

The lower package LP may include a first package substrate 100c, a lower semiconductor chip 10 attached to an upper surface of the first package substrate 100c, an auxiliary chip 20 attached to a lower surface of the first package substrate 100c, an encapsulant 50 encapsulating the lower semiconductor chip 10 and the auxiliary chip 20, and a second package substrate 200 covering the encapsulant 50.

The lower semiconductor chip 10 may include a lower semiconductor substrate 12 having an active surface and an inactive surface opposite to each other, a lower semiconductor device 14 formed at the active surface of the lower semiconductor substrate 12, and a plurality of lower chip pads 16 disposed on the first surface of the lower semiconductor chip 10. The lower semiconductor chip 10 and the first package substrate 100c may be electrically connected with each other through a plurality of lower chip connecting members 18. The lower semiconductor chip 10 may be the semiconductor chip 10 as shown in FIG. 1.

The first package substrate 100c is substantially the same as the package substrate 100 shown in FIG. 1, and thus overlapping descriptions may be omitted. The first package substrate 100c may include a first substrate base 110, a plurality of first substrate upper surface pads 122 and a plurality of first substrate lower surface pads 124 respectively disposed on an upper surface and a lower surface of the first substrate base 110, and a plurality of substrate vias 128 passing through at least a portion of the first substrate base 110. In some embodiments, the first substrate base 110 may have a stacked structure of a plurality of first base layers, and the first package substrate 100c may further include a plurality of first internal wiring patterns 126 disposed on an upper surface and/or a lower surface of each of the plurality of first base layers. In some embodiments, the first package substrate 100c may further include a first solder resist layer 130 covering the upper and lower surfaces of the first substrate base 110 and including a first upper surface solder resist layer 132 and a first lower surface solder resist layer 134.

The encapsulant 50 is substantially similar to the encapsulant 50 shown in FIG. 1, but may have a plurality of through-via holes 50VH extending from an upper surface of the encapsulant 50 to a lower surface of the encapsulant 50. A plurality of through-connecting members 58 may be disposed in the plurality of through-via holes 50VH.

The second package substrate 200 may include a second substrate base 210, a plurality of second substrate upper surface pads 222 and a plurality of second substrate lower surface pads 224 respectively disposed on the upper and lower surfaces of the second substrate base 210, and a plurality of second substrate vias 228 passing through at least a portion of the second substrate base 210. In some embodiments, the second package substrate 200 may further include a plurality of second internal wiring patterns similar to the plurality of first internal wiring patterns 126 of the first package substrate 100. In some embodiments, the second package substrate 200 may further include a second solder resist layer 230 covering the upper and lower surfaces of the second substrate base 210 and including a second upper surface solder resist layer 232, and a second lower surface solder resist layer 234. The second package substrate 200 is substantially similar to the first package substrate 100c, and thus overlapping descriptions may be omitted.

The plurality of through connection members 58 may electrically connect some of the plurality of second substrate lower surface pads 224 to the plurality of first substrate upper surface pads 122.

The upper package UP may include a third package substrate 300, an upper semiconductor chip 410 attached to an upper surface of the third package substrate 300, and an upper molding member 450 surrounding the upper semiconductor chip 410.

The third package substrate 300 may include a third substrate base 310, a plurality of third substrate upper surface pads 322 and a plurality of third substrate lower surface pads 324 respectively disposed on the upper and lower surfaces of the third substrate base 310, and a plurality of third substrate vias 328 passing through at least a portion of the third substrate base 310. In some embodiments, the third package substrate 300 may further include a plurality of third internal wiring patterns similar to the plurality of first internal wiring patterns 126 of the first package substrate 100. In some embodiments, the third package substrate 300 may further include a third solder resist layer 330 covering the upper and lower surfaces of the third substrate base 310 and including a third upper surface solder resist layer 332, and a third lower surface solder resist layer 334. The third package substrate 300 is substantially similar to the second package substrate 200, and thus overlapping descriptions may be omitted.

The upper semiconductor chip 410 may include an upper semiconductor substrate 412 having an active surface and an inactive surface opposite to each other, an upper semiconductor device 414 formed at the active surface of the upper semiconductor substrate 412, and a plurality of upper chip pads 416 disposed on the first surface of the upper semiconductor chip 410. The upper semiconductor chip 410 and the third package substrate 300 may be electrically connected with each other through a plurality of upper chip connecting members 418. The plurality of upper chip connecting members 418 may connect the plurality of upper chip pads 416 to the plurality of third substrate upper surface pads 322, respectively. The upper semiconductor chip 410 is substantially similar to the lower semiconductor chip 10, and thus overlapping descriptions may be omitted.

In some embodiments, the lower semiconductor chip 10 may be a central processing unit chip, a graphic processing unit chip, or an application processor chip, and the upper semiconductor chip 410 may be a memory semiconductor chip.

In some embodiments, an upper underfill layer 460 surrounding the plurality of upper chip connecting members 418 may be between the second surface (i.e., the lower surface) of the upper semiconductor chip 410 and the third package substrate 300. In some embodiments, the upper molding member 450 may cover the upper surface of the third package substrate 300 and surround the upper semiconductor chip 410 and the upper underfill layer 460.

FIG. 13 illustrates that the upper semiconductor chip 410 has a face-up arrangement and is attached to the upper surface of the third package substrate 300, but is not limited thereto. For example, the upper semiconductor chip 410 may have a face-down arrangement and may be attached to the upper surface of the third package substrate 300.

The lower package LP of the semiconductor package 1000 is shown to be configured similarly to the semiconductor package 1 shown in FIG. 1, but may be configured similarly to the semiconductor package 1-1, 1-2, 1a, 1b, 2, 2-1, 2-2, 2a, 2b, 3, 3a, 4, 4a, 4b as shown in FIGS. 2A, 2B, 3A, 3B, 4, 5A, 5B, 6A, 6B, 7A, 7B, 8A, 8B, and 8C, respectively.

Figure 14:
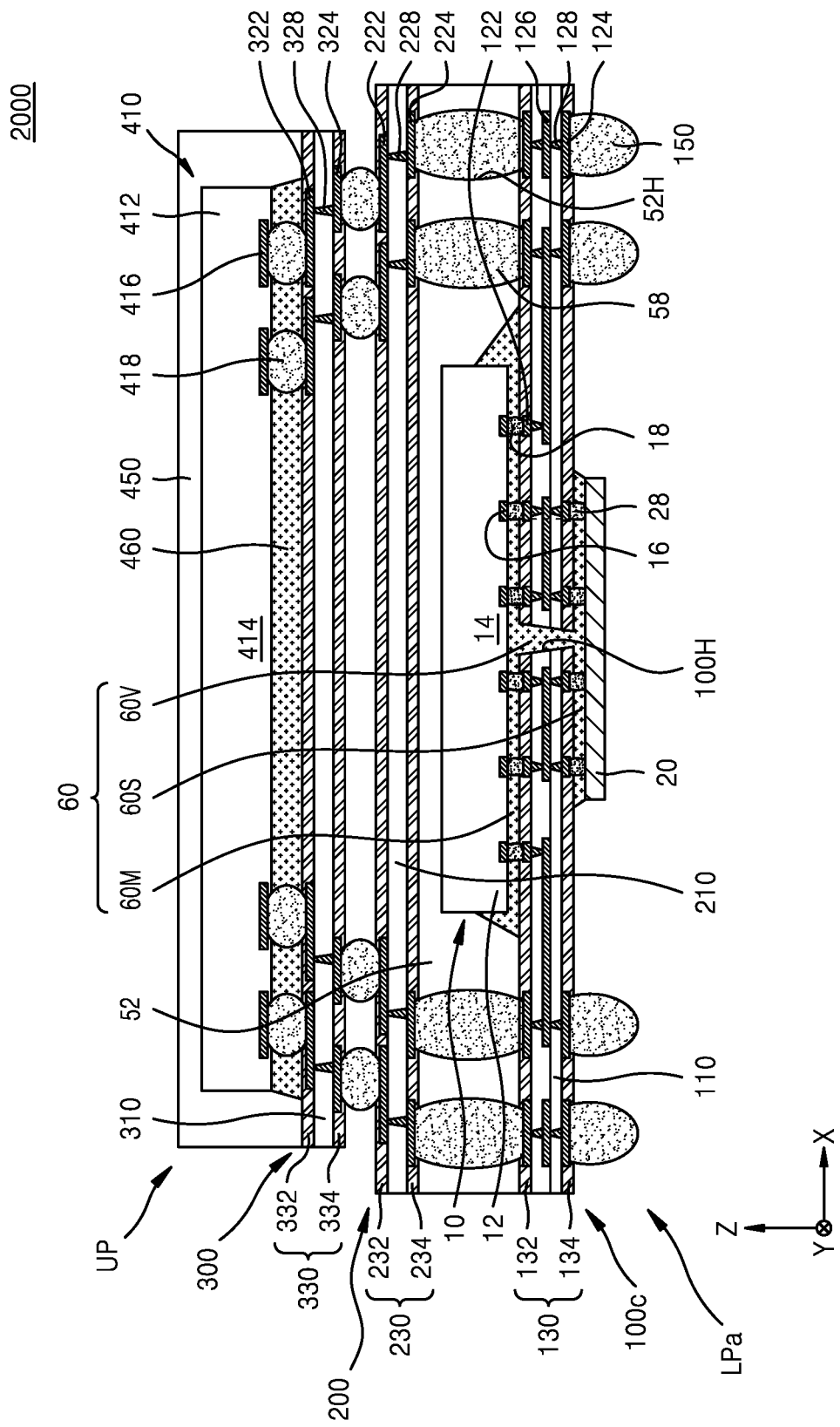
FIG. 14 is a cross-sectional view of a PoP-type semiconductor package according to embodiments of the inventive concept.

FIG. 14 is a cross-sectional view of a PoP-type semiconductor package according to embodiments of the inventive concept. In the description given with reference to FIG. 14, descriptions already given with reference to FIGS. 9A to 11 and FIG. 13 may be omitted.

Referring to FIG. 14, a semiconductor package 2000 may be a package on package (PoP) type semiconductor package in which an upper package UP is attached on a lower package LPa.

The lower package LPa may include a first package substrate 100c, a lower semiconductor chip 10 attached to an upper surface of the first package substrate 100c, an auxiliary chip 20 attached to a lower surface of the first package substrate 100c, a first encapsulant 52 encapsulating the lower semiconductor chip 10 and the auxiliary chip 20, and a second package substrate 200 covering the first encapsulant 52.

The first encapsulant 52 is substantially similar to the first encapsulant 52 as shown in FIG. 9A, but may have a plurality of through-via holes 52H extending from an upper surface of the first encapsulant 52 to a lower surface of the first encapsulant 52. The plurality of through-connecting members 58 may be disposed in the plurality of through-via holes 52H.

The second package substrate 200 may further include a second encapsulant 60 filling between the upper surface of the first package substrate 100c and the lower surface of the lower semiconductor chip 10, between the lower surface of the first package substrate 100c and the lower surface of the auxiliary chip 20, and the at least one communication hole 100H.

The upper package UP may include a third package substrate 300, an upper semiconductor chip 410 attached to an upper surface of the third package substrate 300, and an upper molding member 450 surrounding the upper semiconductor chip 410.

The lower package LPa of the semiconductor package 2000 is shown to be configured similarly to the semiconductor package 5 as shown in FIG. 9A, but may be configured similarly to the semiconductor packages 5a and 6 as shown in FIGS. 9B and 10.

While the inventive concept has been particularly shown and described with reference to embodiments thereof, it will be understood that various changes in form and details may be made therein without departing from the spirit and scope of the following claims.

What is claimed is:

1. A semiconductor package comprising:
a package substrate having a communication hole extending from an upper surface of the package substrate to a lower surface of the package substrate;
a semiconductor chip attached to the upper surface of the package substrate;
an auxiliary chip attached to the lower surface of the package substrate;
a plurality of external connection terminals attached to the lower surface of the package substrate and spaced apart from the auxiliary chip; and
an encapsulant encapsulating the semiconductor chip and the auxiliary chip and filling the communication hole.

2. The semiconductor package of claim 1,
wherein the communication hole has a tapered shape extending from the upper surface of the package substrate to the lower surface of the package substrate with a horizontal width of the communication hole narrowing toward the lower surface of the package substrate.

3. The semiconductor package of claim 1,
wherein the encapsulant is a molded under-fill (MUF),
wherein the encapsulant is formed of a main encapsulation portion, a main underfill portion, an auxiliary encapsulation portion, an auxiliary underfill portion, and a hole filling portion,
wherein the main encapsulation portion, the main underfill portion, the auxiliary encapsulation portion, the auxiliary underfill portion, and the hole filling portion form an integral body of the encapsulant,
wherein the main encapsulation portion covers the semiconductor chip on the upper surface of the package substrate,
wherein the main underfill portion fills a space between a lower surface of the semiconductor chip and the upper surface of the package substrate,
wherein the auxiliary encapsulation portion covers the auxiliary chip on the lower surface of the package substrate,
wherein the auxiliary underfill portion fills a space between an upper surface of the auxiliary chip and the lower surface of the package substrate, and
wherein the hole filling portion fills the communication hole.

4. The semiconductor package of claim 3,
wherein the hole filling portion is connected to each of the main underfill portion and the auxiliary underfill portion.

5. The semiconductor package of claim 3,
wherein the hole filling portion is connected to each of the main encapsulation portion and the auxiliary underfill portion.

6. The semiconductor package of claim 3, further comprising:

a discrete chip spaced apart from the auxiliary chip and attached to the lower surface of the package substrate, wherein the encapsulant encapsulates the auxiliary chip and the discrete chip.

7. The semiconductor package of claim 1, wherein the encapsulant includes:

a first encapsulant covering the semiconductor chip; and a second encapsulant in which a main underfill portion, an auxiliary underfill portion, and a hole filling portion are integrally formed, wherein the main underfill portion fills a space between a lower surface of the semiconductor chip and the upper surface of the package substrate, wherein the auxiliary underfill portion fills a space between an upper surface of the auxiliary chip and the lower surface of the package substrate, and wherein the hole filling portion fills the communication hole.

8. The semiconductor package of claim 7, wherein the main underfill portion includes:

a first main protrusion protruding from the space between the lower surface of the semiconductor chip and the upper surface of the package substrate outwardly and having a first extension length; and a second main protrusion protruding from the space between the lower surface of the semiconductor chip and the upper surface of the package substrate outwardly and having a second extension length greater than the first extension length.

9. The semiconductor package of claim 8, wherein the auxiliary underfill portion includes a first auxiliary protrusion and a second auxiliary protrusion extending outward from a space between the upper surface of the auxiliary chip and the lower surface of the package substrate, and wherein an extension length of the first auxiliary protrusion is equal to an extension length of the second auxiliary protrusion.

10. The semiconductor package of claim 1, wherein the communication hole includes a first communication hole and a second communication hole, wherein a portion of the encapsulant fills each of the first communication hole and the second communication hole, wherein the auxiliary chip includes a first auxiliary chip and a second auxiliary chip spaced apart from each other and each attached to the lower surface of the package substrate, wherein the encapsulant includes a first encapsulant and a second encapsulant, wherein the second encapsulant includes a main underfill portion, a first auxiliary underfill portion, and a first hole filling portion that form an integral body, wherein the main underfill portion fills a space between a lower surface of the semiconductor chip and the upper surface of the package substrate, wherein the first auxiliary underfill portion fills a space between an upper surface of the auxiliary chip and the lower surface of the package substrate, wherein the first hole filling portion fills the first communication hole, wherein the first encapsulant includes a main encapsulation portion, an auxiliary encapsulation portion, a second auxiliary underfill portion, and a second hole filling portion that form an integral body, wherein the main encapsulation portion covers the semiconductor chip and the main underfill portion, wherein the auxiliary encapsulation portion covers the second auxiliary chip on the lower surface of the package substrate, wherein the second auxiliary underfill portion fills a space between an upper surface of the second auxiliary chip and the lower surface of the package substrate, and wherein the second hole filling portion fills the second communication hole.

11. The semiconductor package of claim 1, wherein a first side surface of the auxiliary chip is spaced apart from a first external connection terminal of the plurality of external connection terminals with a separation distance of less than 100 µm, and wherein the first side surface of the auxiliary chip is most adjacent to the first external connection terminal among the plurality of external connection terminals.

12. A semiconductor package comprising:

a lower package including a lower semiconductor chip;

an upper package stacked on the lower package and having an upper semiconductor chip, wherein the lower package comprises a first package substrate with a communication hole extending from an upper surface of the first package substrate to a lower surface of the first package substrate with a horizontal width of the communication hole narrowing toward the lower surface of the first package substrate, wherein the lower semiconductor chip is attached to the upper surface of the first package substrate; an auxiliary chip attached to the lower surface of the first package substrate;

an encapsulant having a plurality of through-via holes extending from an upper surface of the encapsulant to a lower surface of the encapsulant, covering a portion of the lower semiconductor chip and the auxiliary chip, and filling the communication hole;

a second package substrate covering the encapsulant; and a plurality of through-connecting members filling the plurality of through-via holes, respectively, and connecting the first package substrate to the second package substrate.

13. The semiconductor package of claim 12, wherein each of the lower semiconductor chip and the auxiliary chip overlaps the communication hole in a vertical direction.

14. The semiconductor package of claim 12, wherein the encapsulant includes:

a first encapsulant covering the lower semiconductor chip, and a second encapsulant including a main underfill portion, an auxiliary underfill portion, and a hole filling portion that form an integral body, wherein the main underfill portion fills a space between a lower surface of the lower semiconductor chip and the upper surface of the first package substrate, wherein the auxiliary underfill portion fills a space between an upper surface of the auxiliary chip and the lower surface of the first package substrate, and wherein the hole filling portion fills the communication hole.

15. The semiconductor package of claim 12, wherein the auxiliary chip overlaps the communication hole in a vertical direction, without overlapping the lower semiconductor chip.

16. The semiconductor package of claim 12, wherein the encapsulant includes a main encapsulation portion, a main underfill portion, an auxiliary encapsulation portion, an auxiliary underfill portion, and a hole filling portion that form an integral body, wherein the main encapsulation portion covers the lower semiconductor chip on the upper surface of the first package substrate, wherein the main underfill portion fills a space between a lower surface of the lower semiconductor chip and the upper surface of the first package substrate, wherein the auxiliary encapsulation portion covers the auxiliary chip on the lower surface of the first package substrate, wherein the auxiliary underfill portion fills a space between an upper surface of the auxiliary chip and the lower surface of the first package substrate, and wherein the hole filling portion fills the communication hole.

17. The semiconductor package of claim 16,
wherein a horizontal width of the main encapsulation portion has a value greater than a horizontal width of the auxiliary encapsulation portion.

18. A semiconductor package comprising:
a package substrate including:
a substrate base,
a plurality of substrate upper surface pads, and
a plurality of substrate lower surface pads disposed on an upper surface of the substrate base and a lower surface of the substrate base,
wherein the plurality of substrate lower surface pads are electrically connected to the plurality of substrate upper surface pads, and
wherein the package substrate includes a communication hole having a tapered shape extending from the upper surface of the substrate base to the lower surface of the substrate base with a horizontal width of the communication hole narrowing toward the lower surface of the substrate base;
a semiconductor chip including a plurality of chip pads disposed on a first surface of the semiconductor chip, wherein the first surface faces the package substrate and is attached to the upper surface of the substrate base;
a plurality of chip connecting members connecting the plurality of chip pads to the plurality of substrate upper surface pads;

an auxiliary chip attached to the lower surface of the substrate base and connected to first corresponding substrate lower surface pads of the plurality of substrate lower surface pads through a plurality of chip terminals;

a plurality of external connection terminals spaced apart from the auxiliary chip and attached to second corresponding substrate lower surface pads of the plurality of substrate lower surface pads; and an encapsulant including a main underfill portion, an auxiliary underfill portion, and a hole filling portion, wherein the main underfill portion, the auxiliary underfill portion, and the hole filling portion integrally form the encapsulant, wherein the main underfill portion fills a space between the first surface of the semiconductor chip and an upper surface of the package substrate and encapsulates the plurality of chip connection members, wherein the auxiliary underfill portion fills a space between an upper surface of the auxiliary chip and a lower surface of the package substrate and encapsulates the plurality of chip terminals, and wherein the hole filling portion fills the communication hole and is connected to the main underfill portion and the auxiliary underfill portion.

19. The semiconductor package of claim 18,
wherein the encapsulant includes a first encapsulant, and a second encapsulant including the main underfill portion, the auxiliary underfill portion, and the hole filling portion, and
wherein the first encapsulant encapsulates the main underfill portion and the semiconductor chip.

20. The semiconductor package of claim 18,
wherein the encapsulant includes a main encapsulation portion encapsulating the semiconductor chip and the main underfill portion, and an auxiliary encapsulation portion encapsulating the auxiliary chip and the auxiliary underfill portion, and
wherein the main encapsulation portion, the main underfill portion, the auxiliary encapsulation portion, the auxiliary underfill portion, and the hole filling portion are integrally formed together.

* * * * *